(12) United States Patent
Fujita et al.

(10) Patent No.: US 8,796,914 B2
(45) Date of Patent: Aug. 5, 2014

(54) ORGANIC ELECTROLUMINESCENCE ELEMENT, ORGANIC ELECTROLUMINESCENCE DISPLAY, AND ORGANIC ELECTROLUMINESCENCE DISPLAY APPARATUS

(75) Inventors: Yoshimasa Fujita, Osaka (JP); Hidenori Ogata, Osaka (JP); Ken Okamoto, Osaka (JP); Yuhki Kobayashi, Osaka (JP); Makoto Yamada, Osaka (JP); Katsumi Kondoh, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/637,631

(22) PCT Filed: Jan. 27, 2011

(86) PCT No.: PCT/JP2011/051650
§ 371 (c)(1),
(2), (4) Date: Sep. 26, 2012

(87) PCT Pub. No.: WO2011/125363
PCT Pub. Date: Oct. 13, 2011

(65) Prior Publication Data
US 2013/0016296 A1 Jan. 17, 2013

(30) Foreign Application Priority Data

Apr. 7, 2010 (JP) .................................. 2010-088732

(51) Int. Cl.
*H01L 51/50* (2006.01)
(52) U.S. Cl.
CPC ..................... *H01L 51/50* (2013.01)
USPC ............................ 313/501; 313/504; 428/690

(58) Field of Classification Search
CPC ....................................................... H01L 51/54
USPC .................. 428/690; 313/501, 504, 506, 507
See application file for complete search history.

(56) References Cited

U.S. PATENT DOCUMENTS

| 5,126,214 A | 6/1992 | Tokailin et al. |
| 7,250,715 B2 * | 7/2007 | Mueller et al. ................. 313/485 |

(Continued)

FOREIGN PATENT DOCUMENTS

| JP | 3-152897 A | 6/1991 |
| JP | 9-80434 A | 3/1997 |

(Continued)

OTHER PUBLICATIONS

English translation of JP09-092466, Apr. 4, 1997.*

(Continued)

*Primary Examiner* — Mary Ellen Bowman
(74) *Attorney, Agent, or Firm* — Morrison & Foerster LLP

(57) ABSTRACT

The present invention includes: a reflective electrode (2); a translucent electrode (10); an organic EL layer (21) for emitting blue light, the organic EL layer being sandwiched between the reflective electrode and the translucent electrode; a red fluorescent substance layer (13) for converting the light from the organic EL layer (21) into red light; a green fluorescent substance layer (14) for converting the light from the organic EL layer (21) into green light; and a blue pixel including a light-distribution-characteristic adjusting layer (15) for adjusting a light distribution characteristic of the light from the organic EL layer (21), the present invention being structured such that the reflective electrode (2) and the translucent electrode (10) produce a microcavity effect.

20 Claims, 10 Drawing Sheets

(56) References Cited

U.S. PATENT DOCUMENTS

| | | |
|---|---|---|
| 2002/0175619 A1 | 11/2002 | Kita et al. |
| 2004/0212296 A1* | 10/2004 | Nakamura et al. ............ 313/504 |
| 2007/0200492 A1* | 8/2007 | Cok et al. ...................... 313/506 |
| 2008/0093977 A1 | 4/2008 | Bechtel et al. |
| 2009/0212696 A1* | 8/2009 | Terao ............................. 313/506 |

FOREIGN PATENT DOCUMENTS

| | | |
|---|---|---|
| JP | 9-92466 A | 4/1997 |
| JP | 2002-359076 A | 12/2002 |
| JP | 2004-14335 A | 1/2004 |
| JP | 2004-205974 A | 7/2004 |
| JP | 2008-516405 A | 5/2008 |
| JP | 2009-205928 A | 9/2009 |

OTHER PUBLICATIONS

International Search Report received for PCT Patent Application No. PCT/JP2011/051650, mailed on Mar. 8, 2011, 5 pages (2 pages of English Translation and 3 pages of PCT Search Report).

* cited by examiner

F I G. 1
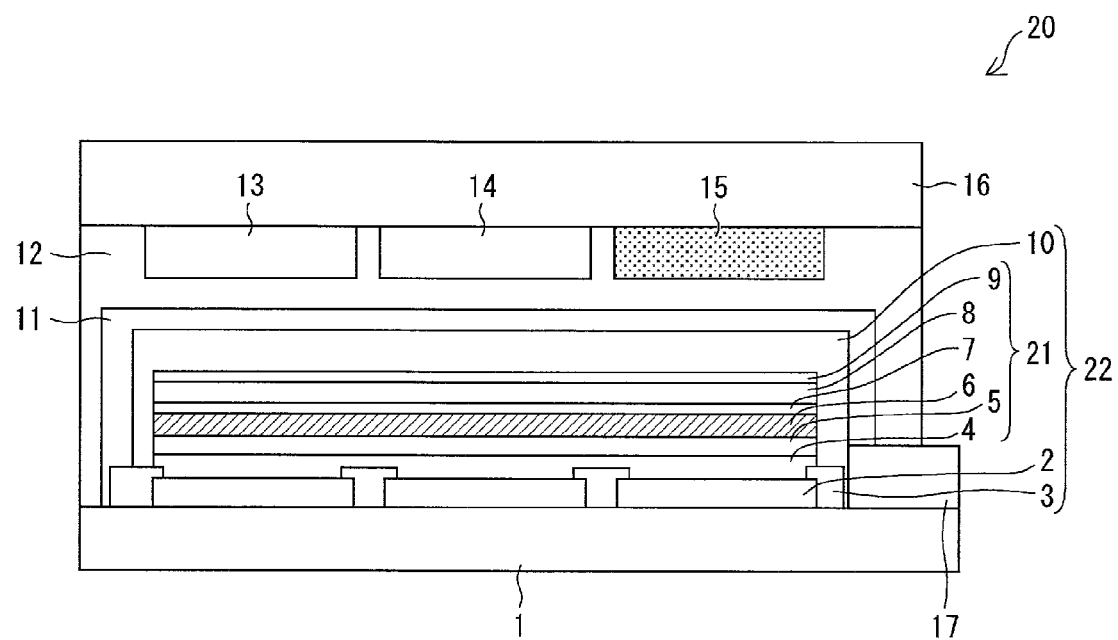

F I G. 4
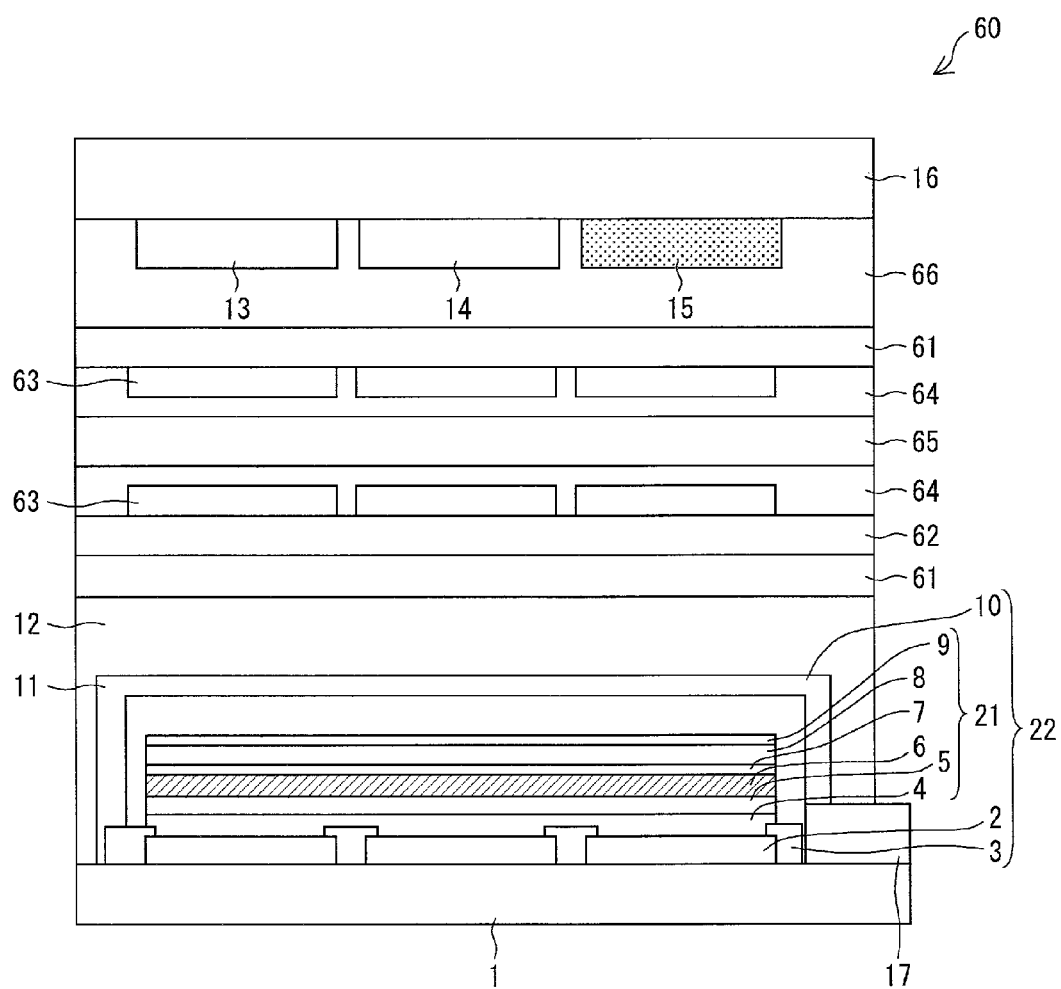

F I G. 6
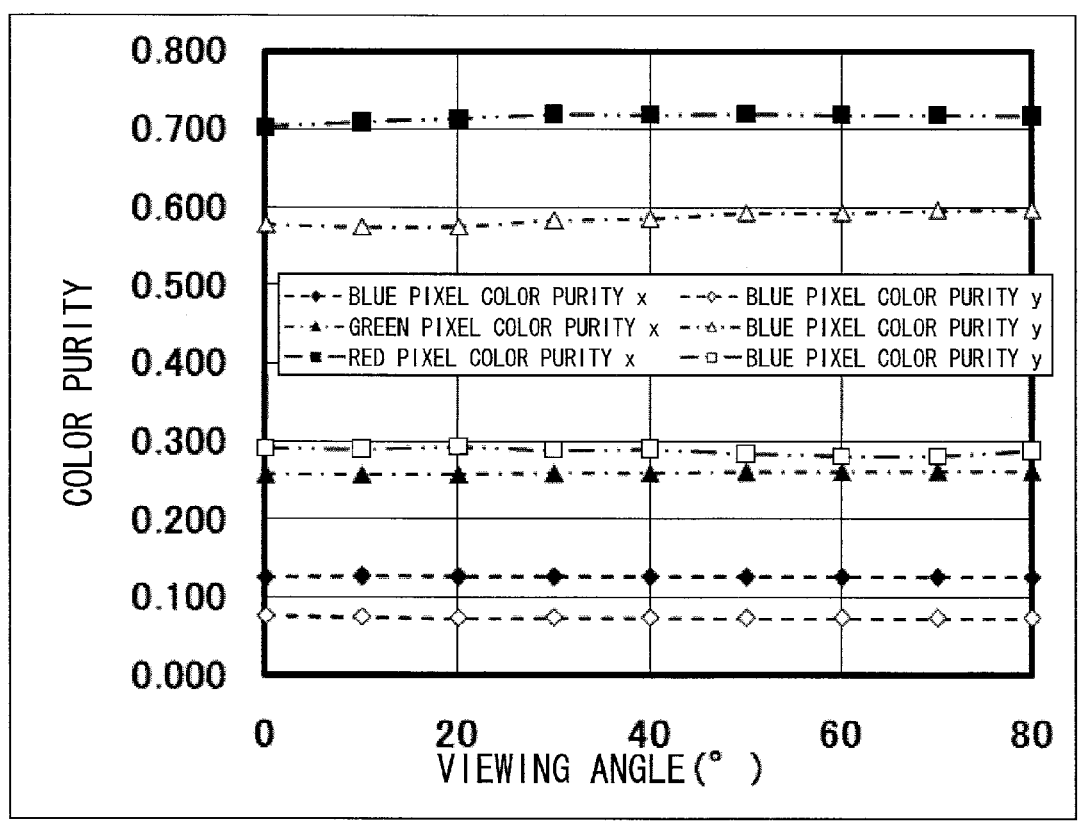

ORGANIC ELECTROLUMINESCENCE ELEMENT, ORGANIC ELECTROLUMINESCENCE DISPLAY, AND ORGANIC ELECTROLUMINESCENCE DISPLAY APPARATUS

CROSS REFERENCE TO RELATED APPLICATIONS

This is a U.S. National Phase patent application of PCT/JP2011/051650, filed Jan. 27, 2011, which claims priority to Japanese Patent Application No. 2010-088732, filed Apr. 7, 2010, each of which is hereby incorporated by reference in the present disclosure in its entirety.

TECHNICAL FIELD

The present invention relates to an organic EL element, an organic EL display, and an organic EL display apparatus.

BACKGROUND ART

Recent years have witnessed a growing need for a flat-panel display along with advances in the information society. Known examples of a flat-panel display include a non-self-light-emitting liquid crystal display (LCD), a self-light-emitting plasma display (PDP), an inorganic electroluminescent (inorganic EL) display, and an organic electroluminescent (hereinafter referred to as "organic EL" or "organic LED") display. Among these flat-panel displays, the organic EL display has made particularly notable progress.

An organic EL display uses such known techniques as (i) a technique for displaying a moving image by a simple matrix drive and (ii) a technique for displaying a moving image by active-matrix driving of an organic EL element with use of a thin film transistor (TFT).

Further, there has been known a method of adjacently arranging, as a single unit, a set of (i) a pixel emitting red light, (ii) a pixel emitting green light, and (iii) a pixel emitting blue light. This method thus creates various colors such as white to display a full-color image. Preparation of such red, green, and blue pixels typically involves, for a conventional organic EL element, a method of separately painting individual organic light-emitting layers by a mask vapor deposition method that uses a shadow mask.

Patent Literature 1 discloses a method for carrying out a full-color display with use of a combination of (i) an organic EL element including a light-emitting layer that emits blue or blue-green light with (ii) a fluorescent material section that absorbs light emitted from the light-emitting layer and that emits visible fluorescence.

Patent Literatures 2, 3, 4, and 5 each disclose an organic EL element having an optical microcavity structure. Patent Literatures 3 and 4 each disclose a method of using, for each of a red pixel (R), a green pixel (G), and a blue pixel (B), a color converting section that absorbs light emitted from an organic EL element and that emits visible fluorescence. Patent Literature 2 discloses a method of causing (i) an organic EL element to emit light in the blue range, (ii) a green pixel to convert the emitted light in the blue range into light in the green range, and (iii) a red pixel to convert the emitted light in the blue range into light in the red range. Patent Literature 5 discloses an arrangement of disposing a light-emitting layer and a color exchanging layer in the middle of the space between a pair of light reflecting layers.

CITATION LIST

Patent Literature 1
Japanese Patent Application Publication, Tokukaihei, No. 3-152897 A (Publication Date: Jun. 28, 1991)
Patent Literature 2
Japanese Patent Application Publication, Tokukaihei, No. 9-92466 A (Publication Date: Apr. 4, 1997)
Patent Literature 3
Japanese Patent Application Publication, Tokukai, No. 2002-359076 A (Publication Date: Dec. 13, 2002)
Patent Literature 4
Japanese Patent Application Publication, Tokukai, No. 2004-14335 A (Publication Date: Jan. 15, 2004)
Patent Literature 5
Japanese Patent Application Publication, Tokukai, No. 2009-205928 A (Publication Date: Sep. 10, 2009)

SUMMARY OF INVENTION

Technical Problem

The above conventional method of separately painting individual organic light-emitting layers requires a mask having a size that is equivalent to or larger than the size of a substrate. This has created a need to prepare and process a mask that can handle a substrate, which is increasingly large-sized in recent years. In particular, the field of a large-sized display represented by a television (TV) involves an increasingly large-sized substrate as from G6 to G8 and to G10. Preparation and processing of a mask, however, requires an extremely thin metal film (typically from 50 to 100 nm in thickness), which makes it extremely difficult to produce a large-sized mask.

Further, the above method requires high accuracy in mask processing and alignment. Low accuracy in mask processing and alignment can cause color mixture due to a mix of light-emitting layers. In the case where an insulating layer provided between pixels has a width that is increased for prevention of color mixture, a non-light-emitting portion has a smaller area if the area for the pixels is fixed in advance. In other words, such an increased width leads to a decrease in aperture ratio of the pixels, resulting in decreased luminance, increased power consumption, and shortened life.

Conventional methods of forming an organic layer dispose a deposition source below a substrate and deposit an organic material in an upward direction from below. Use of a large-sized substrate (and an accordingly large-sized mask) thus causes a problem of a mask being bent at a central portion. A similar problem occurs due also to thermal expansion of a mask during deposition. A bend in a mask can also cause the above-mentioned color mixture. A severe bend in a mask can even result in a defect of (i) a portion with no organic layer formed thereon and/or (ii) a leak between upper and lower electrodes.

In conventional methods, a mask becomes unusable due to degradation after it has been used a particular number of times. The problem of a large-sized mask thus leads to an increase in cost of display production. For an organic EL display, in particular, preventing a cost increase is an extremely important issue.

The technique disclosed in Patent Literature 1 uses a light-emitting layer that emits isotropic light, and thus suffers from a great light loss before the emitted light reaches the fluorescent material section, resulting in a decrease in luminous efficiency. A low luminous efficiency leads to a high power consumption. Thus, increasing luminous efficiency is important in the field of a display, a display apparatus and the like.

An organic EL element is, in the case where it includes an organic fluorescent material for a light-emitting layer, incapable of causing a peak wavelength in an emission spectrum of light from the light-emitting layer to be sufficiently short. Such an organic EL element further has a large half width of approximately 80 nm. This prevents the organic EL element from emitting light having sufficient color purity. In the case where the organic EL element includes, for a light-emitting layer, an organic phosphorescent material, which is superior in luminous efficiency to an organic fluorescent material, it has further decreased color purity. Thus, it is important for an organic EL element to have increased emission intensity and increased color purity.

To increase the emission intensity and color purity of light from a light-emitting layer, it is effective for an organic EL element to have a microcavity structure. FIG. 10 illustrates (i) an emission spectrum of light from an organic EL element having a microcavity structure and (ii) an emission spectrum of light from an organic EL element having a non-microcavity structure. As illustrated in FIG. 10, an organic EL element having a microcavity structure has an emission intensity and color purity that are higher than those of an organic EL element having a non-microcavity structure. The microcavity structure can consequently improve luminous efficiency.

However, the respective techniques disclosed in Patent Literatures 2, 3, 4, and 5, each of which uses a microcavity structure, pose such problems as below.

Patent Literatures 3 and 4 each include a color converting section for each of R, G, and B. Thus, these techniques, in order to excite a fluorescent substance in the color converting section for the blue pixel, each require an organic EL element to include a light-emitting layer that emits light having a wavelength which is shorter than that of light in the blue range. Such an arrangement leads to such problems as (i) a decrease in the luminous efficiency of light from the light-emitting layer and (ii) a shortened life.

The technique disclosed in Patent Literature 2 converts, for each of the green and red pixels, light in the blue range, the light being emitted from an organic EL element, into fluorescence with use of a fluorescent substance layer or the like for light emission. This technique, on the other hand, uses the blue-range light, emitted from the organic EL element, without conversion for the blue pixel. While an organic EL element having a microcavity structure emits light having a directivity, light from the red pixel and green pixel is converted by a fluorescent substance layer into isotropic light. The luminance and color purity of light from the red pixel and green pixel consequently do not vary depending on the viewing angle. On the other hand, light from the blue pixel, which light is light from an organic EL element and has not been converted, has a directivity, and its luminance and color purity thus vary depending on the viewing angle. This indicates that the above technique causes a problematic difference, depending on the viewing angle, between (i) the luminance and color purity of light from the red pixel and green pixel and (ii) the luminance and color purity of light from the blue pixel.

In the case where the light distribution characteristic is different among the pixels of the different colors as such, the emission visibility and emission intensity balance are both disturbed depending on the viewing angle. For instance, there occurs (i) a problem of blue light having a luminance that is significantly low depending on the viewing angle as compared to those of red light and green light and/or (ii) a problem of color purity varying between a frontal view and an oblique view. This problematically leads to such a phenomenon as an image being white in a frontal view but being yellow in an oblique view. Such a problem is critical for a display and a display apparatus.

The method disclosed in Patent Literature 5 is a method for producing a microcavity effect in a layer including a light-emitting layer and a color converting layer. This method, however, causes light from the pixels of all the colors to have a directivity. This raises another problem of a poor viewing-angle characteristic.

The present invention has been accomplished in view of the above problems with conventional art. It is an object of the present invention to inexpensively provide an organic EL element that is for use in an organic EL display and organic EL display apparatus each including an organic EL element having a structure producing a microcavity effect and that has a good viewing-angle characteristic and only a small viewing-angle-dependent difference in luminance and color purity between pixels of the individual colors.

Solution to Problem

In order to solve the above problems, an organic EL element of the present invention includes: a reflective electrode; a translucent electrode; an organic EL layer for emitting blue light, the organic EL layer being sandwiched between the reflective electrode and the translucent electrode; a red fluorescent substance layer for converting the light from the organic EL layer into light in a red range; a green fluorescent substance layer for converting the light from the organic EL layer into light in a green range; and a blue pixel including a light-distribution-characteristic adjusting layer for adjusting a light distribution characteristic of the light from the organic EL layer, the organic EL element being structured such that the reflective electrode and the translucent electrode produce a microcavity effect.

The above arrangement, with use of a structure that produces a microcavity effect, allows emission of light that has a directivity and that is high in luminance in the frontal direction (hereinafter referred to also as "frontal luminance"). This makes it possible to achieve high luminous efficiency and have a longer life. The above arrangement can thus help reduce costs and power consumption.

The red fluorescent substance layer and the green fluorescent substance layer can each (i) absorb light emitted from the organic EL layer and having a directivity and (ii) emit light that is more isotropic. The blue pixel, with use of the light-distribution-characteristic adjusting layer, adjusts a light distribution characteristic (for example, luminance and color purity) of light from the organic EL layer. This arrangement makes it possible to adjust the light distribution characteristic to produce isotropic light.

The above arrangement can (i) reduce a viewing-angle-dependent difference in light distribution characteristic between pixels of the individual colors, and can thus (ii) reduce variation in balance between respective light distribution characteristics for the individual colors which variation occurs between a case in which an image is viewed in the frontal direction and a case in which an image is viewed in an oblique direction. Further, in the case where light from pixels of the individual colors is all isotropic, it is possible to achieve a good viewing-angle characteristic. Thus, in the case where the organic EL element of the present invention is included in a display or a display apparatus, it is possible to provide a high-quality organic EL display and a high-quality organic EL display apparatus. The present invention is suitably applicable to a large-sized display and a large-sized display apparatus as well.

In order to solve the above problems, an organic EL display of the present invention includes any of the above-described organic EL elements.

The above arrangement makes it possible to provide an organic EL display which has a good viewing-angle characteristic and for which viewing-angle-dependent luminance and viewing-angle-dependent color purity are each identical among pixels of the individual colors.

In order to solve the above problems, an organic EL display apparatus of the present invention includes any of the above-described organic EL displays.

The above arrangement makes it possible to inexpensively provide an organic EL display apparatus that has a good viewing-angle characteristic and that has only a small viewing-angle-dependent difference in luminance and color purity between pixels of the individual colors.

Advantageous Effects of Invention

As described above, an organic EL element of the present invention includes: a reflective electrode; a translucent electrode; an organic EL layer for emitting blue light, the organic EL layer being sandwiched between the reflective electrode and the translucent electrode; a red fluorescent substance layer for converting the light from the organic EL layer into light in a red range; a green fluorescent substance layer for converting the light from the organic EL layer into light in a green range; and a blue pixel including a light-distribution-characteristic adjusting layer for adjusting a light distribution characteristic of the light from the organic EL layer, the organic EL element being structured such that the reflective electrode and the translucent electrode produce a microcavity effect. This makes it possible to inexpensively provide an organic EL element having a good viewing-angle characteristic and only a small viewing-angle-dependent difference in luminance and color purity between pixels of the individual colors.

Additional objects, features, and strengths of the present invention will be made clear by the description below. Further, the advantages of the present invention will be evident from the following explanation in reference to the drawings.

BRIEF DESCRIPTION OF DRAWINGS

FIG. 1 is a cross-sectional view schematically illustrating a configuration of a main portion of an organic EL display of an embodiment of the present invention.

FIG. 4 is a cross-sectional view schematically illustrating a configuration of a main portion of an organic EL display of another embodiment of the present invention.

FIG. 6 is a graph illustrating viewing-angle-dependent variations in color purity for an organic EL display apparatus of an Example of the present invention.

DESCRIPTION OF EMBODIMENTS

Figure 2:
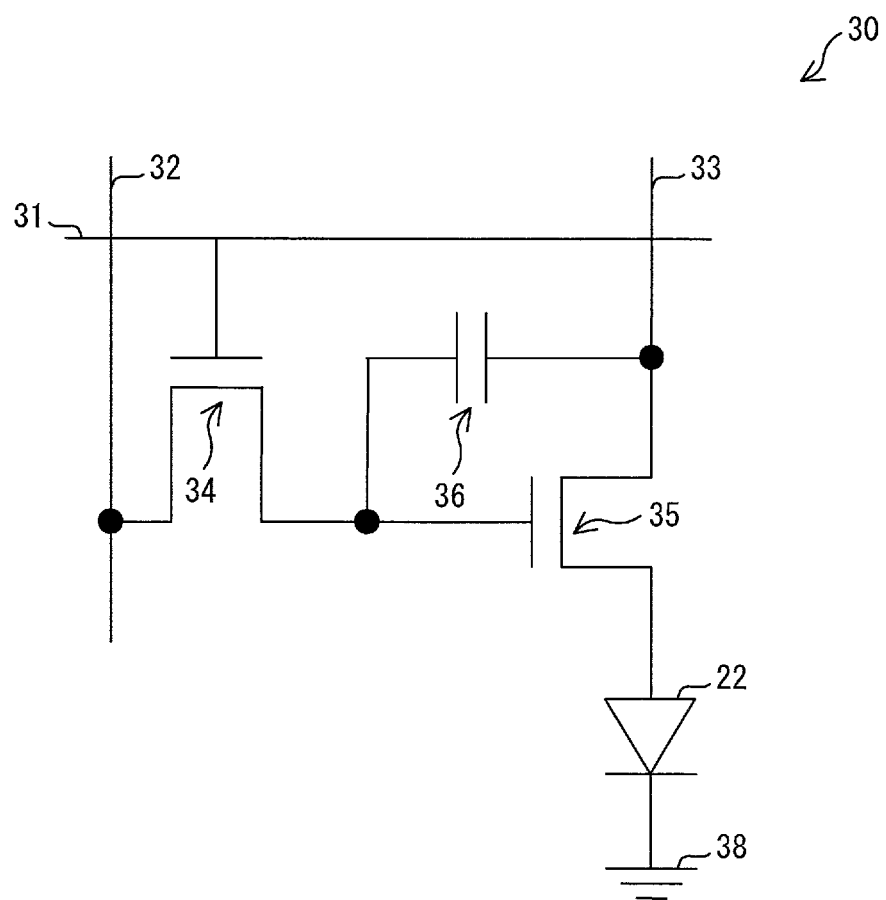
FIG. 2 is a diagram illustrating a configuration of a portion of a circuit included in an organic EL display apparatus of an embodiment of the present invention.

The description below deals in detail with the present invention on the basis of embodiments and examples. The present invention is, however, not limited to those embodiments and examples.

First Embodiment

The following first describes, with reference to FIG. 1, a schematic configuration of a main portion of an organic EL display 20 included in an organic EL display apparatus of an embodiment of the present invention. FIG. 1 is cross-sectional view schematically illustrating a configuration of a main portion of an organic EL display of an embodiment of the present invention. FIG. 1 illustrates a portion of the organic EL display 20 at which portion it includes an organic EL element.

The organic EL display 20 includes, for its organic EL element: a substrate 1; an organic EL section 22; an inorganic sealing film 11; a resin sealing film 12; a red fluorescent substance layer 13; a green fluorescent substance layer 14; a light-distribution-characteristic adjusting layer 15; a sealing substrate 16; and a partition layer 17.

The organic EL display may include a reflective electrode 2, an edge cover 3, the partition layer 17, an organic EL layer 21, and a translucent electrode 10 for the organic EL section 22, which are stacked on the substrate 1 in that order. The substrate 1 may include an active element, such as a TFT, for driving a pixel, the organic EL display 20 or the like.

The partition layer 17 is an insulating layer provided outside the organic EL section 22. The use of the partition layer 17 can hold, for example, an application liquid when the organic EL layer 21 is prepared by a wet process.

The organic EL section 22 includes the reflective electrode 2, the translucent electrode 10, the organic EL layer 21, and the edge cover 3.

The reflective electrode 2 and the translucent electrode 10 are a pair of electrodes that function as a pair, and sandwich the organic EL layer 21. The reflective electrode 2 is an anode, and is an electrode for injecting electron holes into the organic EL layer 21. The translucent electrode 10 is a cathode, and is an electrode for injecting electrons into the organic EL layer 21.

The organic EL layer 21 is a layer that emits blue light, and is sandwiched between the reflective electrode 2 and the translucent electrode 10. The organic EL layer includes: a light-emitting layer 6 including an organic light-emitting material; and a set of (i) an electron hole injection layer 4, (ii) an electron hole transport layer 5, (iii) an electron hole blocking layer 7, (iv) an electron transport layer 8, and (v) an electron injection layer 9, the set functioning as a layer (hereinafter referred to also as "charge injection/transport layer") for injecting or transporting an electric charge. The organic EL layer 21 emits light, which then passes through the translucent electrode 10 to be taken out to the outside.

The edge cover 3 is an insulating cover provided between the reflective electrode 2 and the translucent electrode 10. The edge cover 3 prevents a leak from occurring between the reflective electrode 2 and the translucent electrode 10 at an edge (edge portion) of the reflective electrode 2.

The reflective electrode 2 is separated from the translucent electrode 10 by an optical distance that forms a microcavity for increasing the intensity of blue-range light contained in light that the organic EL layer 21 emits. This indicates that the organic EL section 22 utilizes a microcavity principle based on multiple interference between the reflective electrode 2 and the translucent electrode 10, and thus has a structure (optical microcavity structure) that produces a so-called microcavity effect. Such a structure that produces a microcavity effect is desirably formed by, for instance, setting the thickness between the reflective electrode 2 and the translucent electrode 10 so that the thickness matches the wavelength of light of which the intensity is to be increased. Specifically, with the arrangement in which the organic EL layer 21 is sandwiched between the pair of the reflective electrode 2 and the translucent electrode 10 in an organic EL pixel, (i) the reflective electrode 2 is made of a material having a mirror surface and thus exhibiting total reflection, (ii) the translucent electrode 10 is made of a semi-transmissive material serving as a dielectric mirror, and (iii) the organic EL layer 21 is formed to have a thickness that matches the wavelength of light of which the intensity is to be increased. With this arrangement, a light component in light emitted by the organic EL layer 21 which light component has an undesirably shifted wavelength is repeatedly subjected to multiple reflection between the reflective electrode 2 and the translucent electrode 10 for resonance. This allows the above light component to have an increased, desired wavelength for output.

Figure 10:
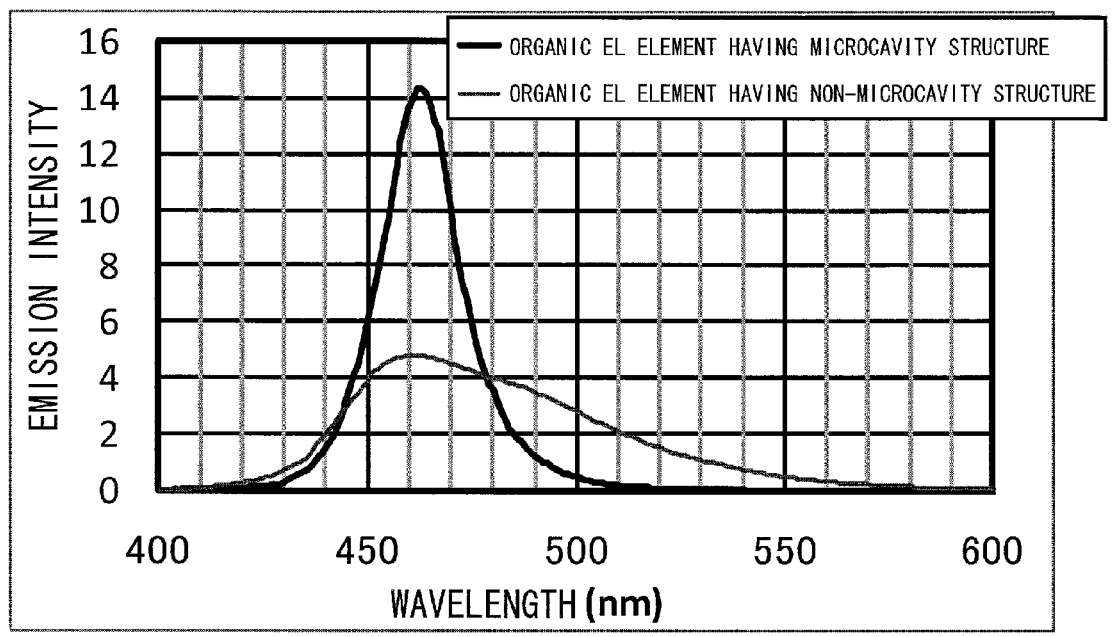
FIG. 10 is a graph illustrating an emission spectrum for an organic EL element having a microcavity structure and an emission spectrum for an organic EL element having a non-microcavity structure.

An organic EL element having an optical microcavity structure has an increased light emission at a desired wavelength (see FIG. 10). The organic EL section 22 of the present embodiment can accordingly emit blue-range light having an increased intensity. The distance between the reflective electrode 2 and the translucent electrode 10 can be adjusted by adjusting the thickness of the organic EL layer 21.

The inorganic sealing film 11 is a sealing film made of an inorganic compound. The resin sealing film 12 is a sealing film made of resin.

The red fluorescent substance layer 13 is a fluorescent substance layer including a red fluorescent substance that absorbs blue-range light from the organic EL section 22 and that converts it into light in the red range. The red fluorescent substance layer thus functions as a red pixel. The green fluorescent substance layer 14 is a fluorescent substance layer including a green fluorescent substance that absorbs blue-range light from the organic EL section 22 and that converts it into light in the green range. The green fluorescent substance layer functions as a green pixel. This arrangement (i) causes the red fluorescent substance layer 13 and the green fluorescent substance layer 14, in the red pixel and the green pixel respectively, to each absorb directional light from the organic EL section 22, which has an optical microcavity structure, and thus (ii) allows the red pixel and the green pixel to each emit light that is closer to isotropic.

The light-distribution-characteristic adjusting layer 15 is a layer for adjusting the light distribution characteristic of light from the organic EL section 22, and functions as a blue pixel. The term "light distribution characteristic" herein refers to a characteristic related to, for example, the luminance and color purity of light with respect to a viewing angle.

The sealing substrate 16 is a substrate for sealing the above constituent members.

The description below now deals in further detail with the individual constituent members. The present invention is, however, not limited by such a description.

<Substrate 1>

The substrate 1 is an insulating substrate such as (i) an inorganic material substrate made of glass, quartz or the like, (ii) a plastic substrate made of polyethylene terephthalate, polycarbazole, polyimide or the like, or (iii) a ceramics substrate made of alumina or the like, or a metal substrate made of aluminum (Al), iron (Fe) or the like. Any of the above substrates may have a surface coated with an insulator made of silicon oxide ($SiO_2$), an organic insulating material or the like. A metal substrate made of Al or the like may have a surface that has been subjected to an insulating process by a method such as anodic oxidation.

The organic EL display preferably includes, among the above substrates, a plastic substrate or a metal substrate because these substrates can each be, for example, curved or bent with no stress. The organic EL display more preferably includes (i) a plastic substrate coated with an inorganic material or (ii) a metal substrate coated with an inorganic insulating material. While a plastic substrate may problematically let water penetrate through itself and degrade the organic EL layer 21, the above arrangement can prevent such a problem. An organic EL layer 21 is known to be possibly degraded by even a small amount of water. While a metal substrate may cause a leak (short circuit) due to a projection thereof, the above arrangement can prevent such a problem. It is known that since an organic EL layer normally has an extremely small film thickness of approximately 100 to 200 nm, such a projection of the substrate causes a significant current leak (short circuit) at a pixel section.

The substrate 1 may be provided with TFTs formed thereon as active elements. The substrate 1 is in this case preferably a substrate that is not melted or deformed at a temperature of 500° C. or below. The substrate 1 is, in the case where it is a metal substrate, preferably a metal substrate made of an iron-nickel alloy having a linear expansion coefficient of $1 \times 10^{-5}$/° C. or less. This arrangement allows the substrate 1 to have a linear expansion coefficient equivalent to that of glass, and thus makes it possible to form TFTs on a substrate 1 inexpensively with use of a conventional production device. In the case where the substrate 1 is a plastic substrate, which is only resistant to a relatively low temperature, TFTs can be formed on the substrate 1 by means of transfer, that is, TFTs can first be formed on another, glass substrate and then transferred onto the substrate 1.

The organic EL display 20 preferably includes, in each of its pixels, a switching circuit such as a TFT. The following describes, with reference to FIG. 2, a configuration of a circuit including such a switching circuit. FIG. 2 is a diagram illustrating a configuration of a portion of a circuit included in an organic EL display apparatus of an embodiment of the present invention.

The circuit 30 includes, for each pixel: a gate line 31; a signal line 32; a power supply line 33; a switching TFT 34; a driving TFT (active element) 35; a storage capacitor 36; an organic EL section 22; and a grounding line 38.

The circuit 30 includes a plurality of gate lines 31 and a plurality of signal lines 32, and further includes, for each pixel, two TFTs, namely a switching TFT 34 and a driving TFT 35. The switching TFT 34 is disposed at the intersection of a gate line 31 with a signal line 32. The driving TFT 35 is electrically connected to the reflective electrode 2 of an organic EL section 22. The organic EL display 20 can be driven by a method such as a voltage-driven digital gradation method.

The circuit 30 may be electrically connected to external drive circuits (namely, a scan line electrode circuit [source driver], a data signal electrode circuit [gate driver], and a power supply circuit) to drive each organic EL section 22.

<Organic EL Section 22>

The organic EL section 22 preferably emits light that has an emission intensity having a maximum value corresponding to a wavelength of not less than 400 nm and not greater than 480 nm. An organic EL element includes an organic material having a luminous efficiency and life that tend to be reduced in the case where the organic material emits light having a shorter wavelength. In the case where the organic EL section 22 emits light that has an emission intensity having a maximum value corresponding to a wavelength of 400 nm or greater, the luminous efficiency and life can be improved. Further, a fluorescent substance absorbs a smaller light amount with respect to light of 480 nm or greater. A green fluorescent substance, in particular, typically absorbs a significantly smaller light amount with respect to light having a long wavelength of 480 nm or greater. Thus, light from the organic EL section 22 can, in the case where it has a wavelength of 480 nm or less, efficiently excite a fluorescent substance, particularly a green fluorescent substance, for light emission.

The organic EL section 22 of the present embodiment emits light in the blue range. The present embodiment can thus remarkably reduce production costs and material costs as compared to a conventional method of separately painting individual organic light-emitting layers which method causes an organic EL element to have a pattern for each of a red pixel, a green pixel, and a blue pixel.

The present embodiment, which includes an organic EL section 22 having an optical microcavity structure, can achieve a good luminous efficiency and a long life. This in turn makes it possible to inexpensively produce an organic EL display having a low power consumption. Further, the present embodiment is suitably applicable as a large-sized display or a display apparatus as well.

(Organic EL Layer 21)

The organic EL layer 21 of the present embodiment has a multilayer structure, including a light-emitting layer 6 and a charge injection/transport layer. The present invention is, however, not limited to such an arrangement. The organic EL layer may, for example, have a single-layer structure, including a light-emitting layer 6 only. The organic EL layer 21 is not limited by the arrangement of the present embodiment, and can have, for example, any of the following structures (1) to (9):

(1) Light-emitting layer 6
(2) Electron hole transport layer 5/light-emitting layer 6
(3) Light-emitting layer 6/electron transport layer 8
(4) Electron hole transport layer/light-emitting layer 6/electron transport layer 8
(5) Electron hole injection layer 4/electron hole transport layer 5/light-emitting layer 6/electron transport layer 8
(6) Electron hole injection layer 4/electron hole transport layer 5/light-emitting layer 6/electron transport layer 8/electron injection layer 9
(7) Electron hole injection layer 4/electron hole transport layer 5/light-emitting layer 6/electron hole blocking layer 7/electron transport layer 8
(8) Electron hole injection layer 4/electron hole transport layer 5/light-emitting layer 6/electron hole blocking layer 7/electron transport layer 8/electron injection layer 9
(9) Electron hole injection layer 4/electron hole transport layer 5/electron blocking layer/light-emitting layer 6/electron hole blocking layer 7/electron transport layer 8/electron injection layer 9

Each of the light-emitting layer 6, the electron hole injection layer 4, the electron hole transport layer 5, the electron hole blocking layer 7, the electron blocking layer, the electron transport layer 8, and the electron injection layer 9 may have a single-layer structure or a multilayer structure.

The individual layers included in the organic EL layer 21 may each have a thickness of approximately 1 nm to 1000 nm, but preferably has a thickness of 10 nm to 200 nm. The thickness of 10 nm or greater achieves good physical properties (namely, a charge injection property, a charge transport property, a charge trapping property and the like) for each layer in the organic EL layer 21. The thickness of 10 nm or greater can also prevent a pixel defect caused by a foreign body such as dirt. The thickness of 200 nm or less can prevent a driving voltage from increasing due to a resistance component in the organic EL layer 21, and can thus reduce power consumption.

(Light-Emitting Layer 6)

The light-emitting layer 6 preferably includes a light-emitting material (organic light-emitting material) made of an organic compound. The light-emitting layer 6 may be made of, for example, an organic light-emitting material only, or of a combination of a light-emitting dopant and a host material. The light-emitting layer 6 may further include any of an electron hole transport material, an electron transport material, an additive (for example, a donor and an acceptor) and the like. The light-emitting layer 6 may include such materials as dispersed in a high-molecular material (binding resin) or in an inorganic material. In particular, the light-emitting layer 6, for improvement in luminous efficiency and life, preferably includes a light-emitting dopant dispersed in a host material.

The organic light-emitting material can suitably be a publicly known light-emitting material for use in, for example, an organic EL layer. The light-emitting material is, for example, a low-molecular light-emitting material or a high-molecular light-emitting material. The light-emitting material may alternatively be a fluorescent material or a phosphorescent material. The light-emitting material is, in order to reduce power consumption, preferably a phosphorescent material having a high luminous efficiency.

The following lists specific example compounds. The present invention is, however, not limited by the materials below.

Examples of the low-molecular light-emitting material include a fluorescent organic material such as an aromatic dimethylidene compound, an oxadiazole compound, a triazole derivative, a styrylbenzene compound, and a fluorenone derivative. The aromatic dimethylidene compound is, for example, 4,4'-bis(2,2'-diphenylvinyl)-biphenyl (DPVBi). The oxadiazole compound is, for example, 5-methyl-2-[2-[4-(5-methyl-2-benzoxazolyl)phenyl]vinyl]benz oxazole. The triazole derivative is, for example, 3-(4-biphenylyl)-4-phenyl-5-t-butylphenyl-1,2,4-triazole (TAZ). The styrylbenzene compound is, for example, 1,4-bis(2-methylstyryl)benzene.

Examples of the high-molecular light-emitting material include a polyphenylenevinylene derivative and a polyspiro derivative. The polyphenylenevinylene derivative is, for example, poly(2-decyloxy-1,4-phenylene) (DO-PPP). The polyspiro derivative is, for example, poly(9,9-dioctylfluorene) (PDAF).

The light-emitting dopant can suitably be a publicly known dopant material for use in, for example, an organic EL layer.

Examples of such a dopant material include a fluorescence-emitting material and a phosphorescence-emitting organic metal complex. The fluorescence-emitting material is, for example, a styryl derivative. The phosphorescence-emitting organic metal complex is, for example, bis[(4,6-difluorophenyl)-pyridinato-N, C2']picolinate iridium (III) (FIrpic) or bis (4',6'-difluorophenyl pyridinate)tetrakis(1-pyrazole)borate iridium (III) (FIr6).

The host material for use with a dopant can suitably be a publicly known host material for use in, for example, an organic EL layer. Examples of such a host material include the above low-molecular light-emitting material, the above high-molecular light-emitting material, a carbazole derivative, an aniline derivative, and a fluorene derivative. The carbazole derivative is, for example, 4,4'-bis(carbazole)biphenyl, 9,9-di(4-dicarbazole-benzyl)fluorene (CPF), 3,6-bis (triphenylsilyl)carbazole (mCP), or (PCF). The aniline derivative is, for example, 4-(diphenylphosphoyl)-N,N-diphenyl aniline (HM-A1). The fluorene derivative is, for example, 1,3-bis(9-phenyl-9H-fluorene-9-yl)benzene (mD-PFB) or 1,4-bis(9-phenyl-9H-fluorene-9-yl)benzene (pD-PFB).

(Charge Injection/Transport Layer)

The charge injection/transport layer is divided into charge injection layers (namely, the electron hole injection layer 4 and the electron injection layer 9) and charge transport layers (namely, the electron hole transport layer 5 and the electron transport layer 8). The charge injection/transport layer allows an electric charge (electron holes and electrons) to be efficiently injected from electrodes and transported (injected) to the light-emitting layer 6.

The charge injection/transport layer may be made of only a material exemplified below, or may include any additive (for example, a donor or an acceptor). The charge injection/transport layer may alternatively include such a material as dispersed in, for example, a high-molecular material (binding resin) or an inorganic material.

The charge injection/transport layer can be made of a publicly known material, such as an organic EL layer and an organic photo conductor, that is for use in a charge injection/transport layer. Such a material is divided into (i) a material (hereinafter referred to also as "electron hole injection/transport material") for injecting or transporting electron holes and (ii) a material (hereinafter referred to also as "electron injection/transport material") for injecting or transporting electrons. The following lists specific compounds as examples of these materials. The present invention is, however, not limited by the materials below.

The electron hole injection/transport material is, for example, an oxide, an inorganic p-type semiconductor material, a porphyrin compound, an aromatic tertiary amine compound, a low-molecular material, or a high-molecular material. The oxide is, for example, vanadium oxide ($V_2O_5$) or molybdenum oxide ($MoO_2$). The aromatic tertiary amine compound is, for example, N,N'-bis(3-methylphenyl)-N,N'-bis(phenyl)-benzidine (TPD) or N,N'-di(naphthalene-1-yl)-N,N'-diphenyl-benzidine (NPD). The low-molecular material is, for example, a hydrazone compound, a quinacridone compound, or a styrilamine compound. The high-molecular material is, for example, polyaniline (PANI), polyaniline-camphor sulfonic acid (PANI-CSA), 3,4-polyethylene dioxy thiophene/polystyrene sulfonate (PEDOT/PSS), poly(triphenylamine) derivative (Poly-TPD), polyvinylcarbazole (PVCz), poly(p-phenylenevinylene) (PPV), or poly(p-naphthalenevinylene) (PNV).

The electron hole injection layer 4 is preferably made of a material that is lower in energy level of the highest occupied molecular orbital (HOMO) than the electron hole injection/transport material of which the electron hole transport layer 5 is made. The electron hole transport layer 5 is preferably made of a material that is higher in mobility of electron holes than the electron hole injection/transport material of which the electron hole injection layer 4 is made. This arrangement allows more efficient injection and transport of electron holes from the anode.

The electron hole injection/transport material is preferably doped with an acceptor. This arrangement further facilitates injection and transport of electron holes. The acceptor can be made of a publicly known acceptor material for use in an organic EL element. The following lists specific compounds as examples of the above materials. The present invention is, however, not limited by the materials below.

The acceptor material is, for example, an inorganic material, a compound containing a cyano group, a compound containing a nitro group, or an organic material. The inorganic material is, for example, gold (Au), platinum (Pt), tungsten (W), iridium (Ir), phosphoryl chloride ($POCl_3$), hexafluoro arsenic ($AsF_6$), chlorine (Cl), bromine (Br), iodine (I), vanadium oxide ($V_2O_5$), or molybdenum oxide ($MoO_2$). The compound containing a cyano group is, for example, TCNQ (7,7,8,8-tetracyanoquinodimethane), $TCNQF_4$(tetrafluorotetracyanoquinodimethane), TCNE (tetracyanoethylene), HCNB (hexacyano butadiene), or DDQ (dicyclo dicyano benzoquinone). The compound containing a nitro group is, for example, TNF (trinitrofluorenone) or DNF (dinitrofluorenone). The organic material is, for example, fluoranil, chloranil, or bromanil. Preferable among the above is a compound containing a cyano group, such as TCNQ, $TCNQF_4$, TCNE, HCNB, and DDQ, because it can increase the carrier concentration more effectively.

The electron injection/transport material is, for example, a low-molecular material such as an inorganic material serving as an n-type semiconductor, an oxadiazole derivative, a triazole derivative, a thiopyrazine dioxide derivative, a benzoquinone derivative, a naphthoquinone derivative, an anthraquinone derivative, a diphenoquinone derivative, a fluorenone derivative, and a benzodifuran derivative; or a high-molecular material such as poly(oxadiazole) (Poly-OXZ) and polystyrene derivative (PSS). The electron injection material, in particular, is, for example, particularly a fluoride such as lithium fluoride (LiF) and barium fluoride ($BaF_2$) or an oxide such as lithium oxide ($Li_2O$).

The electron injection layer 9 is preferably made of a material that is higher in energy level of the lowest unoccupied molecular orbital (LUMO) than the electron injection/transport material of which the electron transport layer 8 is made. The electron transport layer 8 is preferably made of a material that is higher in mobility of electrons than the electron injection/transport material of which the electron injection layer 9 is made. This arrangement allows more efficient injection and transport of electrons from the cathode.

The electron injection/transport material is, in order to further facilitate injection and transport of electrons, preferably doped with a donor. The donor can be made of a publicly known donor material for use in an organic EL element. The following lists specific compounds as examples of the above materials. The present invention is, however, not limited by the materials below.

The donor material is, for example, an inorganic material, a compound containing an aromatic tertiary amine as its skeleton, a condensed polycyclic compound, or an organic material. The inorganic material is, for example, an alkali metal, an alkali earth metal, a rare earth element, Al, silver (Ag), copper (Cu), or indium (In). The compound containing an aromatic tertiary amine as its skeleton is, for example, an aniline, a phenylenediamine, a benzidine (such as N,N,N',N'-tetraphenyl benzidine, N,N'-bis-(3-methylphenyl)-N,N'-bis-(phenyl)-benzidine, and N,N'-di(naphthalene-1-yl)-N,N'-diphenyl-benzidine), a triphenylamine (such as triphenylamine, 4,4'4"-tris(N,N-diphenyl-amino)-triphenylamine, 4,4'4"-tris(N-3-methylphenyl-N-phenyl-amino)-triphenylamine, and 4,4'4"-tris(N-(1-naphthyl)-N-phenyl-amino)-triphenylamine), or a triphenyldiamine (N,N'-di-(4-methyl-phenyl)-N,N'-diphenyl-1,4-phenylenediamine). The condensed polycyclic compound is, for example, phenanthrene, pyrene, perylene, anthracene, tetracene, or pentacene. The condensed polycyclic compound may contain a substituent group. The organic material is, for example, a TTF (tetrathiafulvalene), dibenzofuran, phenothiazine, or carbazole.

Preferable among the above materials as a donor material is a compound containing an aromatic tertiary amine in its skeleton, a condensed polycyclic compound, or an alkali metal. Such preferable materials can each increase the carrier concentration more effectively.

(Method for Forming Organic EL Layer 21)

The organic EL layer 21 can be formed, with use of an application liquid (that is, an application liquid for forming an organic EL layer) including the above material as dissolved or dispersed in a solvent, by a publicly known wet process based on (i) a coating method such as spin coating, dipping, doctor blade method, discharge coating, and spray coating or (ii) a printing method such as inkjet, relievo printing, intaglio printing, screen printing, and micro gravure coating. The organic EL layer 21 can alternatively be formed of the above material by, for example, (i) a publicly known dry process such as resistance heating vapor deposition, electron beam (EB) vapor deposition, molecular-beam epitaxy (MBE), sputtering, and organic vapor-phase deposition (OVPD) or (ii) a laser transfer method. In the case where the organic EL layer 21 is formed by a wet process, the application liquid for forming an organic EL layer may include an additive, such as a leveling agent and a viscosity adjusting agent, for use in adjusting a physical property of the application liquid.

(Reflective Electrode 2 and Translucent Electrode 10)

The reflective electrode 2 can be made of a publicly known electrode material: The reflective electrode 2 is made of, for example, a metal having a work function of 4.5 eV or greater, such as gold (Au), platinum (Pt), and nickel (Ni). This arrangement allows electron holes to be injected into the organic EL layer 21 more efficiently. Further, the reflective electrode 2 is preferably made of a material that is high in reflectance with respect to light. Such a material is, for example, a reflective metal such as aluminum, silver, gold, an aluminum-lithium alloy, an aluminum-neodymium alloy, and an aluminum-silicon alloy. The reflective electrode 2 can also be, for example, made of a combination of a transparent electrode and an electrode (reflective electrode) including the above reflective metal.

The transparent electrode is made of, for example, an oxide (ITO) including indium (In) and tin (Sn), an oxide ($SnO_2$) including tin (Sn), or an oxide (IZO) including indium (In) and zinc (Zn).

The translucent electrode 10 is preferably a semitransparent electrode. This arrangement allows light from the organic EL layer 21 to be extracted efficiently. The translucent electrode 10 is made of, for example, only a metal or a combination of a metal and a transparent electrode material. The translucent electrode can be made of a metal such as silver, magnesium, aluminum, a silver-magnesium alloy, and gold.

The translucent electrode is preferably made of, among the above materials, silver in terms of reflectance and transmittance.

The reflective electrode 2 preferably has a film thickness of 50 nm or greater. A film thickness of less than 50 nm will increase wiring resistance, which may in turn increase the driving voltage. With the above arrangement, such a risk can be avoided.

The translucent electrode 10 preferably has a film thickness ranging from 5 nm to 30 nm, or more preferably has a film thickness ranging from 10 nm to 30 nm. A film thickness of 5 nm or larger allows sufficient light reflection, which in turn allows sufficient production of an interference effect. A film thickness of 10 nm or larger can further increase the interference effect. A film thickness exceeding 30 nm will cause light transmittance to be significantly lower, which may in turn decrease luminance and luminous efficiency. With a film thickness of 30 nm or smaller, however, such a risk can be avoided.

The reflective electrode 2 and the translucent electrode can each be formed of the above material by a publicly known method such as EB vapor deposition, sputtering, ion plating, and resistance heating vapor deposition.

The reflective electrode 2 and the translucent electrode 10 can each be patterned as necessary by, for example, photolithography or laser abrasion. The present embodiment can alternatively further use a shadow mask in combination to directly form a patterned electrode. The reflective electrode 2 and the translucent electrode 10 may each be patterned in the shape of stripes, for example. In this case, the stripes of the reflective electrode 2 preferably extend in a direction orthogonal to the direction in which the stripes of the translucent electrode 10 extend. Such an arrangement makes it possible to produce an excellent image having a good viewing-angle characteristic.

The arrangement described above allows the organic EL section 22 to emit light that is focused toward a frontal direction, that is, to emit light having a directivity. The arrangement describe above can thus reduce the amount of light that is diffused in directions other than the frontal direction, and increase luminous efficiency for the frontal direction. This in turn (i) allows light emission energy generated in the light-emitting layer 6 of the organic EL section 22 to be propagated more efficiently to the red pixel, the green pixel, and the blue pixel, and can thus (ii) increase frontal luminance.

Further, the use of an interference effect between the reflective electrode 2 and the translucent electrode 10 makes it possible to adjust the emission spectrum of light from the organic EL section 22. The emission spectrum can be adjusted by, for example, adjusting light from the organic EL section so that the light has a desired light emission peak wavelength and half width. The use of the interference effect can thus (i) adjust the spectrum so that the red fluorescent substance and the green fluorescent substance can be excited more effectively, and (ii) improve color purity of light from the blue pixel. The use of the interference effect can consequently achieve advantages such as improving color purity, luminous efficiency, and frontal luminance of light from the organic EL section 22.

The organic EL section 22 is not limited in arrangement to the above, and may, for example, include a dielectric multi-layer film to form an optical microcavity structure.

(Edge Cover 3)

The edge cover 3 can be made of an insulating material, which can be a publicly known insulating material such as an inorganic material and a resin material. The inorganic material is, for example, silicon monoxide (SiO), silicon oxynitride (SiON), silicon nitride (SiN), silicon oxycarbide (SiOC), silicon carbide (SiC), nitrogen-added hafnium silicate (HfSiON), zirconium monoxide (ZrO), hafnium monoxide (HfO), or lanthanum oxide (LaO). The resin material is, for example, an acryl or a polyimide.

The edge cover 3 preferably has a film thickness ranging from 100 nm to 2000 nm. A film thickness of 100 nm or larger provides sufficient insulation, which can (i) effectively prevent a leak between the reflective electrode 2 and the translucent electrode 10, (ii) reduce power consumption, and (iii) prevent the organic EL section from failing to emit light. With a film thickness of 2000 nm or smaller, the film forming process merely requires a short time, which allows improvement in productivity and can prevent the breakage of the translucent electrode 10 by the edge cover 3.

The edge cover 3 can be formed of the above insulating material by a publicly known method such as EB vapor deposition, sputtering, ion plating, and resistance heating vapor deposition. The edge cover can alternatively be patterned by, for example, photolithography based on a publicly known dry method or wet method.

<Fluorescent Substance Layer>

The description below deals with fluorescent substance layers such as the red fluorescent substance layer 13 and the green fluorescent substance layer 14.

The red fluorescent substance layer 13 and the green fluorescent substance layer 14 may each include only a red fluorescent substance or green fluorescent substance, or optionally further include an additive or the like. The red fluorescent substance or green fluorescent substance may alternatively be dispersed in a high-molecular material (binding resin) or in an inorganic material.

The red fluorescent substance and the green fluorescent substance are each in the form of particles, and preferably have an average particle diameter ($d_{50}$) ranging from 0.5 µm to 50 µm, or more preferably have an average particle diameter ranging from 1 µm to 50 µm. In the case where the red fluorescent substance and the green fluorescent substance each have an average particle diameter of 0.5 µm or larger, decrease in luminous efficiency can be prevented. In the case where the average particle diameter is 1 µm or larger, luminous efficiency can be further improved. In addition, an average particle diameter of 50 µm or smaller facilitates forming a flat film as a fluorescent substance layer, and can prevent a space from being formed between (i) the red fluorescent substance layer 13 or green fluorescent substance layer 14 and (ii) the organic EL section 22. In the case where the red fluorescent substance and the green fluorescent substance are each made of an inorganic material, in particular, a space (refractive index: 1.0) between the organic EL section 22 (refractive index: approximately 1.7) and the fluorescent substance layer (refractive index: approximately 2.3) including an inorganic material will problematically (i) prevent light from the organic EL section 22 from reaching the red fluorescent substance layer 13 or green fluorescent substance layer 14 efficiently, and thus (ii) decrease luminous efficiency of those fluorescent substance layers. With the above arrangement, however, such a problem can be prevented.

The fluorescent substance layers each preferably have a film thickness ranging approximately from 100 nm to 100 µm, or more preferably have a film thickness ranging from 1 µm to 100 µm. A film thickness of smaller than 100 nm will make it difficult to sufficiently absorb blue light emitted by the organic EL section 22, which will in turn problematically (i) decrease luminous efficiency or (ii) decrease color purity due to mixing of transmitted blue light with light of a desired color. A film thickness of 1 µm or larger can increase absorption of blue light emitted by the organic EL section 22 and reduce transmitted blue light, which makes it possible to achieve high color purity. A film thickness of 100 µm or smaller both allows sufficient absorption of blue light emitted by the organic EL section 22 and can reduce consumption of materials for the fluorescent substance layers. The arrangement described above can consequently both increase luminous efficiency and reduce material costs.

The red fluorescent substance and the green fluorescent substance can each be a fluorescent substance material described below. The red fluorescent substance and the green fluorescent substance are each preferably made of an inorganic material. This arrangement allows the red fluorescent substance layer 13 and the green fluorescent substance layer 14 to be each highly stable against, for example, degradation due to excitation light and/or degradation due to light emission.

(Fluorescent Substance Material)

The red fluorescent substance and the green fluorescent substance can each be made of a publicly known fluorescent substance material such as an organic fluorescent substance material and an inorganic fluorescent substance material.

The organic fluorescent substance material for the green fluorescent substance is simply required to be, for example, a fluorescence pigment that converts blue excitation light into green light emission. Such a fluorescence pigment is, for example, a coumarin pigment or a naphthalimide pigment. The coumarin pigment is, for example, 2,3,5,6-1H,4H-tetrahydro-8-trifluo methyl quinolizine (9,9a, 1-gh) coumarin (coumarin 153), 3-(2'-benzothiazolyl)-7-diethylamino coumarin (coumarin 6), or 3-(2'-benzoimidazolyl)-7-N,N-diethylamino coumarin (coumarin 7). The naphthalimide pigment is, for example, basic yellow 51, solvent yellow 11, or solvent yellow 116.

The organic fluorescent substance material for the red fluorescent substance is simply required to be, for example, a fluorescence pigment that converts blue excitation light into red light emission. Such a fluorescence pigment is, for example, a cyanin pigment, a pyridine pigment, or a rhodamine pigment. The cyanin pigment is, for example, 4-dicyano methylene-2-methyl-6-(p-dimethylamino styryl)-4H-pyrane. The pyridine pigment is, for example, 1-ethyl-2-[4-(p-dimethylamino phenyl)-1,3-butadienyl]-pyridinium-perchlorate. The rhodamine pigment is, for example, rhodamine B, rhodamine 6G, rhodamine 3B, rhodamine 101, rhodamine 110, basic violet 11, or sulforhodamine 101.

The inorganic fluorescent substance material for the green fluorescent substance is simply required to be made of a fluorescent substance that converts blue excitation light into green light emission. Such a fluorescent substance is, for example, $(BaMg)Al_{16}O_{27}:Eu^{2+}$, $Mn^{2+}$, $Sr_4Al_{14}O_{25}:Eu^{2+}$, $(SrBa)Al_{12}Si_2O_8:Eu^{2+}$, $(BaMg)_2SiO_4:Eu^{2+}$, $Y_2SiO_5:Ce^{3+}$, $Tb^{3+}$, $Sr_2P_2O_7$—$Sr_2B_2O_5:Eu^{2+}$, $(BaCaMg)_5(PO_4)_3Cl:Eu^{2+}$, $Sr_2Si_3O_8$—$2SrCl_2:Eu^{2+}$, $Zr_2SiO_4$, $MgAl_{11}O_{19}:Ce^{3+}$, $Tb^{3+}$, $Ba_2SiO_4:Eu^{2+}$, $Sr_2SiO_4:Eu^{2+}$, or $(BaSr)SiO_4:Eu^{2+}$.

The inorganic fluorescent substance material for the red fluorescent substance is simply required to be made of a fluorescent substance that converts blue excitation light into red light emission. Such a fluorescent substance is, for example, $Y_2O_2S:Eu^{3+}$, $YAlO_3:Eu^{3+}$, $Ca_2Y_2(SiO_4)_6:Eu^{3+}$, $LiY_9(SiO_4)_6O_2:Eu^{3+}$, $YVO_4:Eu^{3+}$, $CaS:Eu^{3+}$, $Gd_2O_3:Eu^{3+}$, $Gd_2O_2S:Eu^{3+}$, $Y(P,V)O_4:Eu^{3+}$, $Mg_4GeO_{5.5}F:Mn^{4+}$, $Mg_4GeO^6:Mn^{4+}$, $K_5Eu_{2.5}(WO_4)_{6.25}$, $Na_5Eu_{2.5}(WO_4)_{6.25}$, $K_5Eu_{2.5}(MoO_4)_{6.25}$, or $Na_5Eu_{2.5}(MoO_4)_{6.25}$.

The above inorganic fluorescent substance may be subjected to a surface reforming treatment as necessary by, for example, (i) a method involving a chemical treatment that uses a silane coupler or the like, (ii) a method involving a physical treatment that adds, for example, microparticles on a sub-micron order, or (iii) a method combining the above two methods.

(High-Molecular Material)

The red fluorescent substance layer 13 and the green fluorescent substance layer 14 may each include the above fluorescent substance material as dispersed in a high-molecular material.

The high-molecular material is, for example, a high-molecular resin. Such a resin is preferably, for example, a photosensitive resin. This arrangement allows a fluorescent substance layer to be patterned by photolithography, and facilitates preparing the red fluorescent substance layer 13 and the green fluorescent substance layer 14. The high-molecular material may be either a single kind of resin or a mixture of a plurality of kinds of resin.

The photosensitive resin is, for example, a photosensitive resin (that is, a photo-curable resist material) containing a reactive vinyl group. Such a photosensitive resin is, for example, an acrylic acid resin, a methacrylic acid resin, a polyvinyl cinnamate resin, or a vulcanite resin.

(Method for Forming Fluorescent Substance Layer)

The description below deals with a method for forming the fluorescent substance layers.

The fluorescent substance layers can each be formed, with use of, for example, an application liquid (that is, an application liquid for forming a fluorescent substance layer) including the above fluorescent substance material and high-molecular material both dissolved and dispersed in a solvent, by a publicly known wet process based on (i) a coating method such as spin coating, dipping, doctor blade method, discharge coating, and spray coating or (ii) a printing method such as inkjet, relievo printing, intaglio printing, screen printing, and micro gravure coating. The fluorescent substance layers can each alternatively be formed of the above fluorescent substance material by (i) a publicly known dry process such as resistance heating vapor deposition, electron beam (EB) vapor deposition, molecular-beam epitaxy (MBE), sputtering, and organic vapor-phase deposition (OVPD) or (ii) a laser transfer method.

The above arrangement makes it possible to, in each of the red and green pixels, to (i) absorb light emitted by the organic EL section 22 and having a directivity and to (ii) extract, to the outside, red light and green light that are isotropically emitted. The above arrangement can thus reduce or even prevent a viewing-angle-dependent change in luminance and color purity.

<Light Distribution Characteristic Adjusting Layer 15>

The light-distribution-characteristic adjusting layer 15 is simply required to be arranged to adjust a light distribution characteristic of light from the organic EL layer 21.

The light-distribution-characteristic adjusting layer 15 of the present embodiment is arranged to adjust the luminance of light from the organic EL layer 21 to allow that luminance to be close to (i) the luminance of light emitted by the red fluorescent substance layer 13 and (ii) the luminance of light emitted by the green fluorescent substance layer 14. The light-distribution-characteristic adjusting layer 15 is further arranged to adjust the color purity of light from the organic EL layer 21 to allow that color purity to be close to (i) the color purity of light emitted by the red fluorescent substance layer 13 and (ii) the color purity of light emitted by the green fluorescent substance layer 14.

The red fluorescent substance layer 13 and the green fluorescent substance layer 14 each emit isotropic light as described above. Thus, the light-distribution-characteristic adjusting layer 15 adjusts the luminance and color purity of light from the organic EL layer 21 in order to adjust the light so that it is isotropic. This arrangement allows the blue pixel to emit isotropic light.

The above arrangement allows only a small difference in luminance and color purity to be caused, depending on the viewing angle, between the pixels of the respective colors of red, green, and blue. The above arrangement can thus reduce a variation in luminance and color purity between, for example, (i) a case of viewing a screen of the organic EL display 20 from the front and (ii) a case of viewing the screen in an oblique direction. Further, the above arrangement causes the pixels of the respective colors to each emit isotropic light, and thus allows for an excellent viewing-angle characteristic, which in turn makes it possible to provide a high-quality organic EL display 20.

The light-distribution-characteristic adjusting layer 15 preferably adjusts a light distribution characteristic (for example, the luminance) of light from the organic EL layer 21 in such a manner as to satisfy the following Formulae (1) and (2):

$$0.8 L_{60R}/L_{0R} < L_{60B}/L_{0B} < 1.2 L_{60R}/L_{0R} \qquad (1)$$

$$0.8 L_{60G}/L_{0G} < L_{60B}/L_{0B} < 1.2 L_{60G}/L_{0G} \qquad (2)$$

In Formulae (1) and (2) above, (i) $L_{0R}$ represents the luminance, in the frontal direction, of light emitted from the red fluorescent substance layer 13, whereas $L_{6R}$ represents the luminance of that light in a direction inclined at an angle of 60 degrees to the frontal direction, (ii) $L_{0G}$ represents the luminance, in the frontal direction, of light emitted from the green fluorescent substance layer 14, whereas $L_{60G}$ represents the luminance of that light in a direction inclined at an angle of 60 degrees to the frontal direction, and (iii) $L_{0B}$ represents the luminance, in the frontal direction, of light emitted from the light-distribution-characteristic adjusting layer 15, whereas $L_{60B}$ represents the luminance of that light in a direction inclined at an angle of 60 degrees to the frontal direction.

In the case where the luminance is adjusted so that the light-distribution-characteristic adjusting layer 15 satisfies Formula (1) above, the ratio between (i) the frontal luminance and (ii) the luminance corresponding to the oblique angle of 60 degrees is adjusted for light from the light-distribution-characteristic adjusting layer 15 and light from the red fluorescent substance layer 13 so that the relational formula of Formula (1) above is satisfied. Thus, in the case where the respective frontal luminances for the blue pixel and the red pixel each are adjusted so that a desired light emission color is produced in the frontal direction, such adjustment can reduce a difference, between the blue pixel and the red pixel, in the ratio of the luminance in the frontal direction and the luminance in an oblique direction. This adjustment can thus reduce the difference in the light emission color between (i) the frontal direction and (ii) an oblique direction to a level at which the difference is invisible.

In the case where the luminance is adjusted so that the light-distribution-characteristic adjusting layer 15 satisfies Formula (2) above, the ratio between (i) the frontal luminance and (ii) the luminance corresponding to the oblique angle of 60 degrees is adjusted for light from the light-distribution-characteristic adjusting layer 15 and light from the green fluorescent substance layer 14 so that the relational formula of Formula (2) above is satisfied. Thus, in the case where the respective frontal luminances for the blue pixel and the green pixel are each adjusted so that a desired light emission color is produced in the frontal direction, such adjustment can reduce a difference, between the blue pixel and the green pixel, in the ratio of the luminance in the frontal direction and the luminance in an oblique direction. This adjustment can thus reduce the difference in the light emission color between (i) the frontal direction and (ii) an oblique direction to a level at which the difference is invisible.

With the above arrangement, the light-distribution-characteristic adjusting layer 15 allows the light distribution characteristic of light emitted by the organic EL layer 21 and having a directivity to be closer to the respective light distribution characteristics of light emitted by the red fluorescent substance layer 13 and light emitted by the green fluorescent substance layer 14. The above arrangement can thus reduce a difference, caused in a case of viewing the screen of the organic EL display 20 in an oblique direction, between (i) the respective luminances of light from the red pixel and light from the green pixel and (ii) the luminance of light from the blue pixel to a level at which the difference is invisible.

The light-distribution-characteristic adjusting layer 15 preferably adjusts a light distribution characteristic (for example, the color purity) of light from the organic EL layer 21 in such a manner as to satisfy the following Formulae (3) through (6):

$$|x_{60R}-x_{0R}| \geq |x_{60B}-x_{0B}| \tag{3}$$

$$|y_{60R}-y_{0R}| \geq |y_{60B}-y_{0B}| \tag{4}$$

$$|x_{60G}-x_{0g}| \geq |x_{60B}-x_{0B}| \tag{5}$$

$$|y_{60G}-y_{0G}| \geq |y_{60B}-y_{0B}| \tag{6}$$

In Formulae (3) through (6) above, (i) ($x_{0R}$, $y_{0R}$) represents the color purity, in the frontal direction, of light emitted from the red fluorescent substance layer 13, whereas ($x_{60R}$, $y_{60R}$) represents the color purity of that light in a direction inclined at an angle of 60 degrees to the frontal direction, (ii) ($x_{0G}$, $y_{0G}$) represents the color purity, in the frontal direction, of light emitted from the green fluorescent substance layer 14, whereas ($x_{60G}$, $y_{60G}$) represents the color purity of that light in a direction inclined at an angle of 60 degrees to the frontal direction, and (iii) ($x_{0B}$, $y_{0B}$) represents the color purity, in the frontal direction, of light emitted from the light-distribution-characteristic adjusting layer 15, whereas ($x_{60B}$, $y_{60B}$) represents the color purity of that light in a direction inclined at an angle of 60 degrees to the frontal direction.

Light from the light-distribution-characteristic adjusting layer 15 is light that has been emitted by the organic EL layer 21 and that has not been converted. There is thus a viewing-angle-dependent variation in not only luminance but also color purity for such light. In other words, light from the light-distribution-characteristic adjusting layer 15 may, even if it has been adjusted for reduction of a difference between the frontal luminance and the luminance in an oblique direction, have a difference between the color purity in the frontal direction and the color purity in an oblique direction.

In the case where the color purity is adjusted so that the light-distribution-characteristic adjusting layer 15 satisfies Formulae (3) and (4) above, the relation between (i) the color purity in the frontal direction and (ii) the color purity in an oblique direction inclined at 60 degrees satisfies Formulae (3) and (4) above for light from the light-distribution-characteristic adjusting layer 15 and light from the red fluorescent substance layer 13. Thus, in the case where the respective frontal luminances of the blue pixel and the red pixel are each adjusted so that a desired light emission color is produced in the frontal direction, such adjustment can reduce a difference between the color purity in the frontal direction and the color purity in an oblique direction. This adjustment can thus reduce the difference (which may be caused even in the case where adjustment has been made for reduction of a difference between the frontal luminance and the luminance in an oblique direction) between the light emission color in the frontal direction and the light emission color in an oblique direction to a level that the difference is invisible.

Similarly, by adjusting the color purity so that the light-distribution-characteristic adjusting layer 15 satisfies Formulae (5) and (6) above, in the case where the respective frontal luminances of the blue pixel and the green pixel are each adjusted so that a desired light emission color is produced in the frontal direction, such adjustment can reduce a difference between the color purity in the frontal direction and the color purity in an oblique direction. This adjustment can thus reduce the difference (which may be caused even in the case where adjustment has been made for reduction of a difference between the frontal luminance and the luminance in an oblique direction) between the light emission color in the frontal direction and the light emission color in an oblique direction to a level at which the difference is invisible.

The above arrangement can thus reduce the difference, caused in a case of viewing the screen of the organic EL display 20 in an oblique direction, between (i) the respective color purities of light from the red pixel and light from the green pixel and (ii) the color purity of light from the blue pixel to a level at which the difference is invisible.

The light-distribution-characteristic adjusting layer 15 can have, for example, a light-scattering characteristic or a light-diffusing characteristic. The "light-scattering characteristic" refers to a combination of a light-diffracting characteristic, a light-refracting characteristic, and a light-reflecting characteristic.

The light-distribution-characteristic adjusting layer 15, in the case where it has a light-scattering characteristic, can be in a form that, for example, includes light-scattering particles for scattering light. The light-scattering particles refer to particles that have a property for scattering incident light by diffraction, refraction, or reflection.

The light-scattering particles preferably have an average particle diameter $d_{50(B)}$ that satisfies the following Formulae (7) and (8):

$$0.8 d_{50(B)} < d_{50(R)} < 1.2 d_{50(B)} \tag{7}$$

$$0.8 d_{50(B)} < d_{50(G)} < 1.2 d_{50(B)} \tag{8}$$

In Formulae (7) and (8) above, (i) $d_{50(R)}$ represents the average particle diameter for the red fluorescent substance, and (ii) $d_{50(G)}$ represents the average particle diameter for the green fluorescent substance.

Light emitted from the light-distribution-characteristic adjusting layer 15 is light that has been emitted by the organic EL layer 21 and that has not been converted. This light, as described above, differs from isotropic light emission from a fluorescent substance layer (for which the luminance and color purity vary only a little depending on the viewing angle) in that the luminance and color purity of the light vary greatly depending on the viewing angle. This variation results in a viewing-angle-dependent variation in luminance and color purity between (i) light from the red pixel and light from the green pixel and (ii) light from the blue pixel. In the case where, however, the respective average particle diameters of the red fluorescent substance, the green fluorescent substance, and the light-scattering particles satisfy Formulae (7) and (8) above, the light-distribution-characteristic adjusting layer 15 can, for example, scatter or diffuse light from the organic EL layer 21 in order to adjust the light distribution characteristic of such light so that the light distribution characteristic is close to the respective light distribution characteristics of light from the red pixel and light from the green pixel.

In other words, the light-distribution-characteristic adjusting layer 15 can cause the light distribution characteristic of light emitted by the organic EL layer 21 and having a directivity to be closer to the respective light distribution characteristics of light emitted by the red fluorescent substance layer 13 and light emitted by the green fluorescent substance layer 14. Thus, with the above arrangement, the difference between (i) the luminance and color purity of light emitted by the blue pixel and (ii) the luminance and color purity of light emitted by the red pixel and the green pixel is extremely small. Consequently, the difference, observed in the case of viewing the screen of the organic EL display 20 in an oblique direction, between (i) the respective luminances and color purities of red light and green light and (ii) the luminance and color purity of blue light can be reduced to a level at which the difference is invisible.

The light-scattering particles are particles (minute particles) preferably having an average particle diameter ($d_{50}$) of not less than 0.5 μm and not greater than 50 μm, or more preferably having an average particle diameter of not less than 1 μm and not greater than 50 μm. If the average particle diameter of the light-scattering particles is 1 μm or less, the light-scattering particles will each have a small particle diameter, which will make it impossible to sufficiently produce the effect of adjusting, in a desired manner, the light distribution characteristic of blue-range light entering the light-distribution-characteristic adjusting layer 15. This will in turn cause emitted light to have a light intensity in the frontal direction which light intensity is higher than that in an oblique direction. If the average particle diameter is 0.5 μm or smaller, the tendency described above will be more significant. In the case where the average particle diameter of the light-scattering particles is 0.5 μm or greater, or more preferably 1 μm or greater, such an arrangement makes it possible to (i) fully utilize the function of the light-distribution-characteristic adjusting layer 15 for adjusting a light distribution characteristic and thus (ii) suitably adjust a light distribution characteristic. This arrangement in turn makes it possible to reduce the difference between (i) the light distribution characteristic of light from the light-distribution-characteristic adjusting layer 15 and (ii) the respective light distribution characteristics of light from the red fluorescent substance layer 13 and light from the green fluorescent substance layer 14.

If the average particle diameter of the light-scattering particles is 50 μm or greater, the light-distribution-characteristic adjusting layer 15 will have a highly uneven surface, which will cause the effect of scattering due to the surface unevenness to be dominant over scattering inside the light-distribution-characteristic adjusting layer 15. This will in turn make it impossible to produce the effect of adjusting a light distribution characteristic to a desired characteristic. In contrast, in the case where the average particle diameter of the light-scattering particles is 50 μm or less, the light-distribution-characteristic adjusting layer 15 has small unevenness on a surface thereof, which can reduce the difference between (i) the light distribution characteristic of light emitted from the light-distribution-characteristic adjusting layer 15 and (ii) the respective light distribution characteristics of light from the red fluorescent substance layer 13 and light from the green fluorescent substance layer 14. Thus, the above arrangement allows the luminance and color purity of light emitted by the blue pixel to be closer to the luminance and color purity of light emitted by the red pixel and the green pixel. The above arrangement thus makes it possible to achieve an excellent viewing-angle characteristic.

The light-distribution-characteristic adjusting layer 15 may include either only light-scattering particles or a combination of (i) light-scattering particles and (ii) a resin material or the like. In the case where the light-distribution-characteristic adjusting layer 15 includes a combination of light-scattering particles and a resin material or the like, (i) the light-scattering particles are preferably dispersed in the resin material or the like, and (ii) the light-scattering particles preferably have a refractive index that is different from the refractive index of the resin material or the like. The refractive index of the light-scattering particles may be either larger or smaller than that of the resin material or the like. Further, the difference in refractive index between the light-scattering particles and the resin material or the like is preferably large. The refractive index of the light-scattering particles and that of the resin material or the like preferably has a ratio ranging from 1.1 to 1.5, or more preferably has a ratio ranging from 1.2 to 1.3. This arrangement allows light having a directivity to be converted into isotropic light efficiently.

The light-distribution-characteristic adjusting layer 15 has a light-scattering property that depends greatly on (i) the particle diameter (d) of the light-scattering particles and (ii) the wavelength ($\lambda$) of incident light. The light-distribution-characteristic adjusting layer 15 scatters light mainly in the following three patterns:

Geometrical scattering: $d \gg \lambda$
Mie scattering: $d \approx \lambda$
Rayleigh scattering: $d < \lambda$ Mie scattering, among the above three scattering patterns, is preferable because it allows forward-scattered light to be larger in amount than backward-scattered light. In other words, the light-scattering particles preferably each have a particle diameter that is approximately equal to the wavelength of incident light.

The present invention is simply required to adjust the light distribution characteristic of only blue light. This makes it possible to prepare a light-distribution-characteristic adjusting layer 15 with use of a simple arrangement. In the case where, for instance, respective light distribution characteristics of light of two or more colors are adjusted, it is normally necessary to adjust the light distribution characteristic for the wavelength of light of each color, which requires patterning a light-distribution-characteristic adjusting layer for each color. Such a case, however, poses a problem of complex arrangement and process. The present invention can, however, avoid such a problem.

(Light-Scattering Particle)

The description below deals in detail with the light-scattering particles.

The light-scattering particles may be made of either an organic material or an inorganic material. The light-scattering particles are, however, preferably made of an inorganic material. Such an arrangement allows light emitted from the organic EL section 22 and having a directivity to be diffused or scattered more isotropically and effectively. Further, the use of an inorganic material makes it possible to prepare a light-distribution-characteristic adjusting layer 15 that is stable with respect to light and heat.

The light-scattering particles are preferably high in transparency. The light-scattering particles, in the case where they are mixed with a resin material for use, preferably have a refractive index with a ratio to that of the resin material which ratio falls within any of the above numerical ranges.

The light-scattering particles are, in the case where they are made of an inorganic material, such particles (minute particles) as those each including, as a main component, an oxide of at least one metal selected from the group consisting of silicon, titanium, zirconium, aluminum, indium, zinc, tin, and antimony.

The light-scattering particles are, in the case where they are particles (inorganic minute particles) made of an inorganic material, such beads as silica beads (refractive index: 1.44), alumina beads (refractive index: 1.63), titanium oxide beads (refractive index of the anatase-type: 2.50; refractive index of the rutile-type: 2.70), zirconia oxide beads (refractive index: 2.05), or zinc oxide beads (refractive index: 2.00).

The light-scattering particles are, in the case where they are particles (organic minute particles) made of an organic material, such beads as polymethylmethacrylate beads (refractive index: 1.49), acryl beads (refractive index: 1.50), acryl-styrene copolymer beads (refractive index: 1.54), melamine beads (refractive index: 1.57), highly refractive melamine beads (refractive index: 1.65), polycarbonate beads (refractive index: 1.57), styrene beads (refractive index: 1.60), crosslinked polystyrene beads (refractive index: 1.61), polyvinyl chloride beads (refractive index: 1.60), benzoguanamine-melamine formaldehyde beads (refractive index: 1.68), or silicone beads (refractive index: 1.50).

(Resin Material)

The resin material for use in the light-distribution-characteristic adjusting layer 15 is preferably a light-transmitting resin. The resin material is, for example, melamine resin (refractive index: 1.57), nylon (refractive index: 1.53), polystyrene (refractive index: 1.60), melamine beads (refractive index: 1.57), polycarbonate (refractive index: 1.57), polyvinyl chloride (refractive index: 1.60), polyvinylidene chloride (refractive index: 1.61), polyvinyl acetate (refractive index: 1.46), polyethylene (refractive index: 1.53), polymethyl methacrylate (refractive index: 1.49), poly-MBS (refractive index: 1.54), medium-density polyethylene (refractive index: 1.53), high-density polyethylene (refractive index: 1.54), tetrafluoroethylene (refractive index: 1.35), polychlorotrifluoroethylene (refractive index: 1.42), or polytetrafluoroethylene (refractive index: 1.35).

The light-distribution-characteristic adjusting layer 15 is not limited to the above arrangement, and may be arranged in any manner as long as it adjusts the luminance and color purity of light from the organic EL layer 21 as described above. The light-distribution-characteristic adjusting layer 15 may, for instance, have a light diffusing surface which has, for example, an unevenness shape and which thus diffuses light passing therethrough. Such a light-distribution-characteristic adjusting layer 15 is, for example, an optical member such as a microlens and a prism. Further, the light-distribution-characteristic adjusting layer 15 may be provided, for example, on a surface of the sealing substrate 16 from which surface light is emitted.

The arrangement described above allows the organic EL display 20 of the present embodiment to reduce the difference between the respective light distribution characteristics (that is, viewing-angle-dependent variation in luminance and chromaticity) of light from the red pixel, the green pixel, and the blue pixel to a level at which the difference is invisible to the human eye. The above arrangement can thus solve various problems attributed to the difference between the respective light distribution characteristics of red light, green light, and blue light. Such various problems include, for example, the following problem: In the case where (i) red light and green light are isotropic and (ii) blue light has a directivity in the frontal direction, even if an image is so adjusted as to be white as viewed in the frontal direction, that image is, as viewed in an oblique direction, seen to have a color that is shifted to be closer to yellow because the luminance for blue is decreased relative to those of red and green.

The present embodiment, as described above, includes a pixel emitting red light, a pixel emitting green light, and a pixel emitting blue light. Thus, adjusting the respective luminances of light of the individual colors makes it possible to produce a full-color video image. The present embodiment preferably includes, according to need, a pixel emitting, for example, cyan light or yellow light. In this case, such a pixel emitting cyan or yellow light emits light having a color purity that is preferably represented by a dot in the chromaticity diagram which dot is located outside the triangle formed by the dots representative of the respective color purities for the red-, green-, and blue-light-emitting pixels. This arrangement can further widen the color reproduction range as compared to an organic EL display including only pixels emitting light of the three primary colors of red, green, and blue.

<Inorganic Sealing Film 11 and Resin Sealing Film 12>

The inorganic sealing film 11 and the resin sealing film 12 can each be made of a publicly known material and provided by a publicly known sealing method.

The inorganic sealing film 11 is preferably made of a light-transmitting material. The inorganic sealing film 11 is, for example, a film made of a glass, a metal or the like which film seals an inert gas such as nitrogen gas and argon gas. The sealed inert gas preferably contains, for example, a moisture absorbent, such as barium oxide, that is mixed therein. This arrangement can effectively reduce degradation, due to moisture, of the organic EL section. The inorganic sealing film 11 may alternatively be a film made of SiO, SiON, SiN or the like. In this case, the inorganic sealing film 11 can be formed on the translucent electrode 10 by a method such as plasma CVD, ion plating, ion beam method, and sputtering.

The resin sealing film 12 can be made of a publicly known light-transmitting resin. The resin sealing film 12 can be formed on the inorganic sealing film 11, which is formed on the translucent electrode 10, by, for example, (i) applying a resin by spin coating, ODF, or lamination or (ii) combining the translucent electrode 10 with a resin film.

The organic EL display 20 may alternatively be arranged not to include the inorganic sealing film 11. In this case, the resin sealing film 12 is directly formed on the translucent electrode 10 by the above method.

The inorganic sealing film 11 and the resin sealing film 12 can prevent oxygen or water from entering the organic EL section 22 from the outside, and thus allow the organic EL section 22 to have a longer life. The inorganic sealing film 11 and the resin sealing film 12 can further reduce damage caused to, for example, the organic EL section 22 when the sealing substrate 16 is combined with the substrate 1.

<Sealing Substrate 16>

The sealing substrate 16 can be made of a publicly known material and provided by a publicly known sealing method. The sealing substrate 16 is preferably transparent or semi-transparent, and can be, for example, a substrate made of a material such as glass and plastic. This arrangement allows light from the red pixel, the green pixel, and the blue pixel to pass through the sealing substrate 16.

The sealing substrate 16 may, after the red fluorescent substance layer 13, the green fluorescent substance layer 14, and the light-distribution-characteristic adjusting layer 15 have been formed on a surface of the sealing substrate which surface faces the substrate 1, be combined with the substrate 1 on which the organic EL section 22 and the like have been formed. Before such combination, the sealing substrate 16 is preferably provided with, for example, a below-described planarizing film for planarization which planarizing film is provided on the red fluorescent substance layer 13, the green fluorescent substance layer 14, and the light-distribution-characteristic adjusting layer 15 on the sealing substrate 16. This arrangement can prevent a space from being formed between (i) the organic EL section 22 and (ii) the red fluorescent substance layer 13, the green fluorescent substance layer 14, and the light-distribution-characteristic adjusting layer 15, and increase adherence between the substrate 1 and the sealing substrate 16.

The organic EL display 20 of the present embodiment may further include a low reflective film and a color filter. The description below deals with respective arrangements of the low reflective film and the color filter.

<Low Reflective Film>

The low reflective film can be provided at such positions of the organic EL display 20 as a position between color filters, a position between fluorescent substance layers, and a position between a fluorescent substance layer and the light-distribution-characteristic adjusting layer 15. The low reflective film emphasizes light of the individual colors of R, G, and B, and can thus improve visibility.

The low reflective film usable in the organic EL display of the present embodiment can be made of a publicly known material, and is made of, for example, an inorganic material or an organic material. The inorganic material is, for example, silicon oxide ($SiO_2$), silicon nitride (SiN or $Si_2N_4$), or tantalum oxide (TaO or $Ta_2O_5$). The organic material is, for example, an acrylic resin or a resist material.

The low reflective film can be formed by (i) a dry process such as chemical vapor deposition (CVD) and vacuum deposition or (ii) a wet process such as spin coating. The low reflective film may alternatively be patterned by photolithography or the like according to need.

<Color Filter>

The color filter is preferably provided on a surface of each of the red fluorescent substance layer 13, the green fluorescent substance layer 14, and the light-distribution-characteristic adjusting layer 15 from which surface light is emitted. The color filter can be provided, for example, between (i) the sealing substrate 16 and (ii) each of the red fluorescent substance layer 13, the green fluorescent substance layer 14, and the light-distribution-characteristic adjusting layer 15. The color filter can be a publicly known color filter. Providing the color filter makes it possible to (i) increase the respective color purities for the red pixel, the green pixel, and the blue pixel, and thus (ii) widen the color reproduction range of the organic EL display 20 and that of the organic EL display apparatus including the organic EL display 20. A red color filter is preferably provided on the red fluorescent substance layer 13, whereas a green color filter is preferably provided on the green fluorescent substance layer 14. A red color filter and a green color filter, which absorb a blue component and an ultraviolet component of external light, can reduce or prevent light emission, due to external light, of the individual fluorescent substance layers. This in turn makes it possible to reduce or prevent a decrease in contrast.

Second Embodiment

Figure 3:
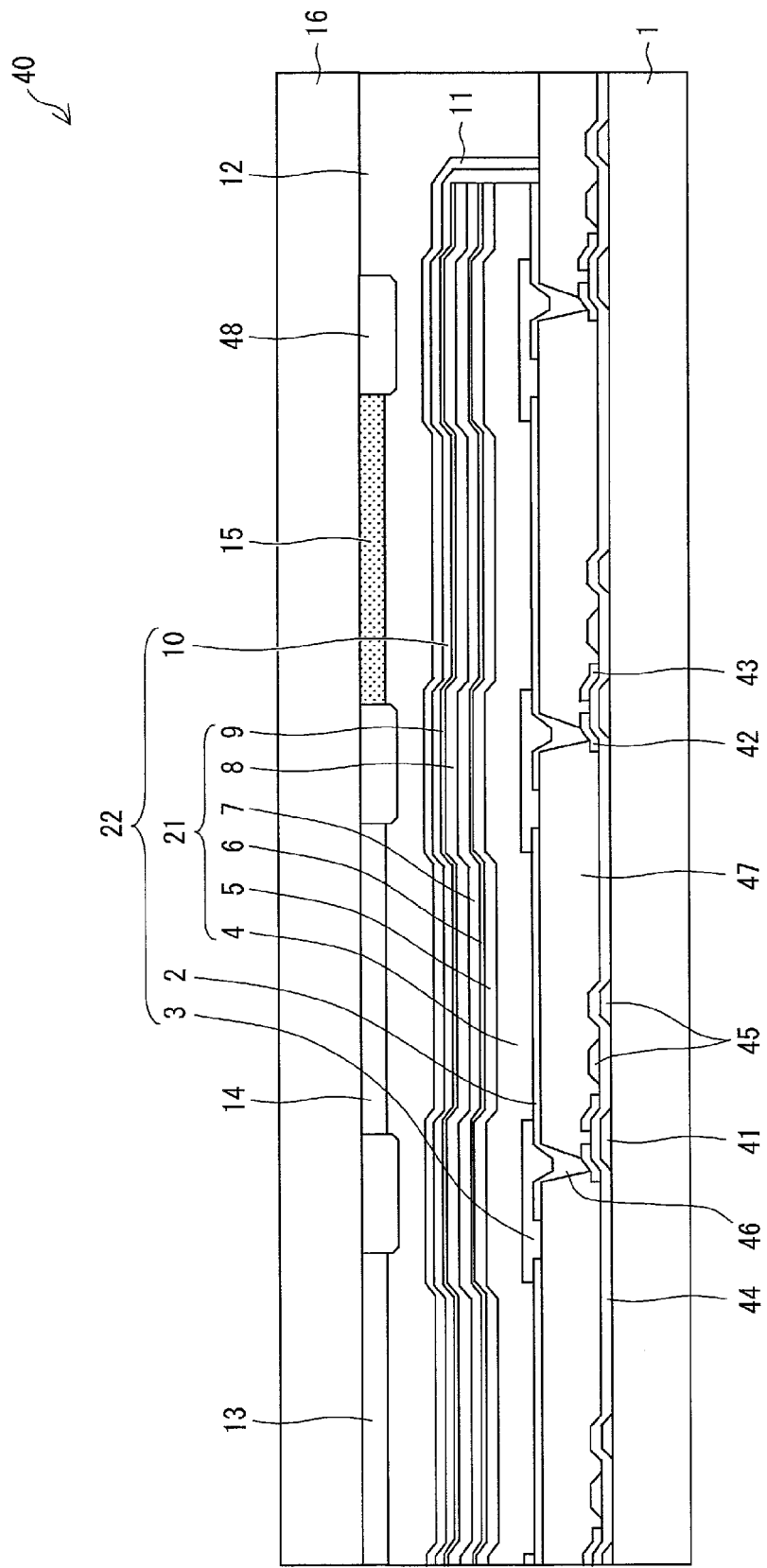
FIG. 3 is a cross-sectional view schematically illustrating a configuration of a main portion of an organic EL display of another embodiment of the present invention.

The following describes, with reference to FIG. 3, a configuration of an organic EL display 40 included in an organic EL display apparatus of a second embodiment of the present invention. FIG. 3 is cross-sectional view illustrating a configuration of a main portion of an organic EL display of the second embodiment of the present invention. FIG. 3 illustrates a portion of the organic EL display 40 at which portion it includes an organic EL element.

For convenience of explanation, constituent elements of the present embodiment that are similar in function to the respective corresponding constituent elements of the first embodiment are each assigned an identical reference numeral, and are not described here. The present embodiment mainly describes how it differs from the first embodiment.

The organic EL display 40 is of an active-matrix driving type, and includes: a substrate 1; a gate electrode 41; a drain electrode 42; a source electrode 43; a gate insulating film 44; a wire 45; a through hole 46; a planarizing film 47; an organic EL section 22; an inorganic sealing film 11; a resin sealing film 12; a red fluorescent substance layer 13; a green fluorescent substance layer 14; a light-distribution-characteristic adjusting layer 15; a black matrix 48; and a sealing substrate 16.

The organic EL display 40 includes TFTs as active elements, and carries out active-matrix driving of the organic EL section 22. This makes it possible to achieve excellent display quality. Further, the organic EL display 40 has a light emission period longer than that of an organic EL display of a passive matrix driving type. This makes it possible to (i) reduce a driving voltage for achieving a desired luminance and thus to (ii) reduce power consumption.

The organic EL display 40 includes, on the substrate 1, (i) a gate electrode 41 forming a plurality of gate lines and (ii) a source electrode 43 forming a plurality of signal lines. The gate electrode 41 crosses the source electrode 43 at intersections, at each of which a TFT is disposed. The organic EL display 40 includes a planarizing film 47 on the TFT. The TFT is thus provided on a side of the reflective electrode 2 which side is opposite to a side on which the organic EL layer 21 is provided.

The organic EL display 40 of the present embodiment is driven by a voltage-driven digital gradation method, and includes two TFTs for each pixel (namely, a switching TFT and a driving TFT). The driving TFT and the reflective electrode 2 of the organic EL section 22 are electrically connected to each other via a contact hole formed in the planarizing film 47. Further, the organic EL display 40 includes a capacitor in each pixel. This capacitor is so disposed as to be connected to the gate electrode 41 of the driving TFT, and is a capacitor for causing a gate potential of the driving TFT to be a constant potential. The present invention is not limited to an organic EL display driven by a voltage-driven digital gradation method, but may be an organic EL display driven by a current-driven analog gradation method.

The organic EL display 40 may alternatively include two or more TFTs each including a compensation circuit in a corresponding pixel. Driving the organic EL section 22 with use of TFTs arranged as such can prevent variation in TFT properties (mobility and a threshold voltage).

The organic EL display 40 of the present embodiment includes a black matrix 48 provided between the red fluorescent substance layer 13, the green fluorescent substance layer 14, and the light-distribution-characteristic adjusting layer 15.

The description below deals in detail with respective arrangements of the TFTs and the planarizing film 47.

<TFT>

The TFTs are preferably formed on the substrate 1 before the organic EL section 22 is prepared. The TFTs are each, for example, a TFT that functions as a switching and driving TFT. The TFTs can be publicly known TFTs. The TFTs of the present invention may be replaced by metal-insulator-metal (MIM) diodes.

The TFTs usable in the organic EL display 40 can each (i) be made of a publicly known material by a publicly known forming method and (ii) have a publicly known structure. The TFT includes an active layer that is made of a material such as (i) an inorganic semiconductor material, for example, amorphous silicon, polycrystalline silicon (polysilicon), microcrystalline silicon, or cadmium selenide, (ii) an oxide semiconductor material, for example, zinc oxide or indium oxide-gallium oxide-zinc oxide, and (iii) an organic semiconductor material, for example, a polythiophene derivative, a thiophene oligomer, a poly(p-phenylenevinylene) derivative, naphthacene or pentacene. The TFT has a structure of, for example, a staggered type, an inverted staggered type, a top-gate type, or a coplanar type.

The active layer included in the TFT can be formed by any of the following example methods: (1) A method of ion-doping an impurity into an amorphous silicon film formed by, for example, plasma-excited chemical vapor deposition (PECVD). (2) A method of (i) forming amorphous silicon by, for example, low pressure chemical vapor deposition (LPCVD) involving use of silane ($SiH_4$) gas, (ii) crystallizing the amorphous silicon by, for example, solid-phase deposition into polysilicon, and then (iii) doping ions into the polysilicon by ion implantation. (3) A method (low-temperature process) of (i) forming amorphous silicon by, for example, LPCVD involving use of $Si_2H_6$ gas or by PECVD involving use of $SiH_4$ gas, (ii) annealing the amorphous silicon with use of a laser such as an excimer laser to crystallize the amorphous silicon into polysilicon, and then (iii) doping ions. (4) A method (high temperature process) of (i) forming a polysilicon layer by LPCVD, PECVD or the like, (ii) thermally oxidizing the polysilicon layer at a temperature of 1000° C. or above to form a gate insulating film, (iii) forming a gate electrode of $n^+$ polysilicon on the gate insulating film, and then (iv) doping ions. (5) A method of forming an organic semiconductor material by a method such as inkjet printing. (6) A method of forming a single-crystal film made of an organic semiconductor material.

The gate insulating film 44 of the TFT for use in the present embodiment can be made of a publicly known material. The gate insulating film is made of, for example, (i) $SiO_2$ formed by a method such as PECVD and LPCVD or (ii) $SiO_2$ formed by thermal oxidation of a polysilicon film.

The source electrode 43, the gate electrode 41, and the drain electrode 42 of the TFT for use in the present embodiment can each be made of a publicly known material such as tantalum (Ta), aluminum (Al), and copper (Cu). The TFTs for use in the organic EL display 40, which TFTs can be formed to have the above arrangement, are not limited by the material, the structure, and the forming method described above.

<Planarizing Film 47>

The planarizing film 47 is formed on the TFTs formed on the substrate 1. The present invention is, however, not limited to such an arrangement, and may, for instance, include (i) an interlayer insulating film formed on the TFTs and (ii) a planarizing film 47 provided on the interlayer insulating film.

The organic EL display 40 includes TFTs formed on the substrate 1. This causes the substrate to have an uneven surface. If the organic EL section 22 is directly formed on such a surface, that unevenness will cause such defects in the organic EL section 22 as a defect in the reflective electrode 2, a defect in the organic EL layer 21, a breakage of the translucent electrode 10, a short circuit between the reflective electrode 2 and the translucent electrode 10, and reduction in pressure resistance.

The present embodiment, which includes a planarizing film 47, can prevent such defects.

The planarizing film 47 can be made of a publicly known material. The planarizing film can be made of a material such as (i) an inorganic material, for example, silicon oxide, silicon nitride, or tantalum oxide, and (ii) an organic material, for example, a polyimide, an acrylic resin, or a resist material. The planarizing film 47 can be formed by a method such as (i) a dry process, for example, CVD or vacuum deposition, and (ii) a wet process, for example, spin coating. The planarizing film 47 may have a single-layer structure or a multilayer structure.

Third Embodiment

The following describes, with reference to FIG. 4, a configuration of an organic EL display 60 of a third embodiment of the present invention. FIG. 4 is cross-sectional view illustrating a configuration of a main portion of an organic EL display of the third embodiment of the present invention. FIG. 4 illustrates a portion of the organic EL display 60 at which portion it includes an organic EL element.

For convenience of explanation, constituent elements of the present embodiment that are similar in function to the respective corresponding constituent elements of the first embodiment are each assigned an identical reference numeral, and are not described here. The present embodiment mainly describes how it differs from the first embodiment.

The organic EL display 60 includes: a substrate 1; an organic EL section 22; an inorganic sealing film 11; a resin sealing film 12; a polarizing film (polarizing plate) 61; a substrate 62; a transparent electrode 63; an alignment film 64; a liquid crystal layer 65; a planarizing film 66; a red fluorescent substance layer 13; a green fluorescent substance layer 14; a light-distribution-characteristic adjusting layer 15; and a sealing substrate 16.

The present embodiment, in other words, differs from the first embodiment in that it includes, between (i) the resin sealing film 12 and (ii) the red fluorescent substance layer 13, the green fluorescent substance layer 14, and the light-distribution-characteristic adjusting layer 15: a polarizing film 61; a substrate 62; a transparent electrode 63; an alignment film 64; a liquid crystal layer 65; and a planarizing film 66.

The substrate 62, the polarizing film 61, the transparent electrode 63, the alignment film 64, and the liquid crystal layer 65 function as a so-called switching element. The substrate 62 is a substrate on which the transparent electrode 63 is formed. The polarizing film 61 is a layer for controlling the transmittance of the liquid crystal layer 65. The transparent electrode 63 is an electrode for driving the liquid crystal layer 65. The alignment film 64 is a film for aligning liquid crystal molecules of the liquid crystal layer 65. The liquid crystal layer 65 is driven by a voltage applied thereto, and carries out switching with respect to a red pixel, a green pixel, and a blue pixel. This arrangement makes it possible to achieve excellent display quality. The substrate 62, the transparent electrode 63, the alignment film 64, and the liquid crystal layer 65 can each be made of a publicly known material.

The planarizing film 66 is formed between (i) the polarizing film 61 and (ii) the red fluorescent substance layer 13, the green fluorescent substance layer 14, and the light-distribution-characteristic adjusting layer 15. The planarizing film 66 can be similar to the planarizing film 47 of the second embodiment. The planarizing film 66 can prevent a space from being formed between (i) the polarizing film 61 and (ii) the red fluorescent substance layer 13, the green fluorescent substance layer 14, and the light-distribution-characteristic adjusting layer 15.

[Supplementary Note]

The present invention is not limited to the description of the embodiments above, but may be altered in various ways by a skilled person within the scope of the claims. Any embodiment based on a proper combination of technical means disclosed in different embodiments is also encompassed in the technical scope of the present invention.

For instance, the organic EL element of the present invention may preferably be arranged such that the light-distribution-characteristic adjusting layer adjusts (i) luminance of the light from the organic EL layer so as to cause the luminance of the light from the organic EL layer to be close to luminance of light emitted from the red fluorescent substance layer and to luminance of light emitted from the green fluorescent substance layer and (ii) color purity of the light from the organic EL layer so as to cause the color purity of the light from the organic EL layer to be close to color purity of the light emitted from the red fluorescent substance layer and to color purity of the light emitted from the green fluorescent substance layer.

With the above arrangement, the blue pixel, with use of the light-distribution-characteristic adjusting layer, adjusts (i) the luminance of light from the organic EL layer so as to cause the luminance of such light to be close to the respective luminances of light from the red fluorescent substance layer and light from the green fluorescent substance layer and (ii) the color purity of light from the organic EL layer so as to cause the color purity of such light to be close to the respective color purities of light from the red fluorescent substance layer and light from the green fluorescent substance layer. The above arrangement thus allows emission of isotropic light.

The above arrangement (i) reduces a viewing-angle-dependent difference in luminance and color purity between pixels of the individual colors, and can thus (ii) reduce variation in balance between respective luminances and color purities for the individual colors which variation occurs between a case in which an image is viewed in the frontal direction and a case in which an image is viewed in an oblique direction. The above arrangement allows light from pixels of the individual colors to be all isotropic, and thus makes it possible to achieve a good viewing-angle characteristic.

The organic EL element of the present invention may preferably be arranged such that the light-distribution-characteristic adjusting layer adjusts the light distribution characteristic of the light from the organic EL layer so as to satisfy Formulae (1) and (2) below:

$$0.8 L_{60R}/L_{0R} < L_{60B}/L_{0B} < 1.2 L_{60R}/L_{0R} \quad (1)$$

$$0.8 L_{60G}/L_{0G} < L_{60B}/L_{0B} < 1.2 L_{60G}/L_{0G} \quad (2)$$

where: $L_{0R}$ represents a luminance, in a frontal direction, of light emitted from the red fluorescent substance layer; $L_{60R}$ represents a luminance, in a direction inclined at 60 degrees to the frontal direction, of the light emitted from the red fluorescent substance layer; $L_{0G}$ represents a luminance, in a frontal direction, of light emitted from the green fluorescent substance layer; $L_{60G}$ represents a luminance, in a direction inclined at 60 degrees to the frontal direction, of the light emitted from the green fluorescent substance layer; $L_{0B}$ represents a luminance, in a frontal direction, of light emitted from the light-distribution-characteristic adjusting layer; and $L_{60B}$ represents a luminance, in a direction inclined at 60 degrees to the frontal direction, of the light emitted from the light-distribution-characteristic adjusting layer.

With the above arrangement, the difference in luminance between (i) light emitted from the blue pixel and (ii) light emitted from the red fluorescent substance layer and the green fluorescent substance layer is extremely small. The above arrangement can thus reduce variation in luminance between (i) red light and green light and (ii) blue light which variation occurs in the case where an image is viewed in an oblique direction. Thus, with the above arrangement, the difference in luminance, which difference occurs in the case where an image is viewed in an oblique direction, between (i) red light and green light and (ii) blue light can be reduced to a level at which the difference is invisible.

The organic EL element of the present invention may preferably be arranged such that the light-distribution-characteristic adjusting layer adjusts the light distribution characteristic of the light from the organic EL layer so as to satisfy Formulae (3) through (6) below:

$$|x_{60R} - x_{0R}| \geq |x_{60B} - x_{0B}| \quad (3)$$

$$|y_{60R} - y_{0R}| \geq |y_{60B} - y_{0B}| \quad (4)$$

$$|x_{60G} - x_{0g}| \geq |x_{60B} - x_{0B}| \quad (5)$$

$$y_{60G} - y_{0G}| \geq |y_{60B} - y_{0B}| \quad (6)$$

where: $(x_{0R}, y_{0R})$ represents a color purity, in a frontal direction, of light emitted from the red fluorescent substance layer; $(x_{60R}, y_{60R})$ represents a color purity, in a direction inclined at 60 degrees to the frontal direction, of the light emitted from the red fluorescent substance layer; $(x_{0G}, y_{0G})$ represents a color purity, in a frontal direction, of light emitted from the green fluorescent substance layer; $(x_{60G}, y_{60G})$ represents a color purity, in a direction inclined at 60 degrees to the frontal direction, of the light emitted from the green fluorescent substance layer; $(x_{0B}, y_{0B})$ represents a color purity, in a frontal direction, of light emitted from the light-distribution-characteristic adjusting layer; and $(x_{60B}, y_{60B})$ represents a color purity, in a direction inclined at 60 degrees to the frontal direction, of the light emitted from the light-distribution-characteristic adjusting layer.

With the above arrangement, the difference in color purity between (i) light emitted from the blue pixel and (ii) light emitted from the red fluorescent substance layer and the green fluorescent substance layer is extremely small. The above arrangement can thus reduce variation in color purity between (i) red light and green light and (ii) blue light which variation occurs in the case where an image is viewed in an oblique direction. Thus, with the above arrangement, the difference in color purity, which difference occurs in the case where an image is viewed in an oblique direction, between (i) red light and green light and (ii) blue light can be reduced to a level at which the difference is invisible.

The organic EL element of the present invention may preferably be arranged such that the light emitted by the organic EL layer has an emission intensity having a maximum value corresponding to a wavelength of not less than 400 nm and not greater than 480 nm.

With the above arrangement, the light emitted by the organic EL layer has an emission intensity having a maximum value corresponding to a wavelength of not less than 400. The above arrangement thus allows improvement in luminous efficiency and a longer life. Further, since the above wavelength is not greater than 480 nm, it is possible to efficiently excite, with use of the light from the organic EL layer, the fluorescent substance layers, especially the green fluorescent substance layer, for light emission.

The organic EL element of the present invention may preferably be arranged such that the light-distribution-characteristic adjusting layer includes light-scattering particles for scattering light; and the organic EL element satisfies Formulae (7) and (8) below:

$$0.8d_{50(B)} < d_{50(R)} < 1.2d_{50(B)} \quad (7)$$

$$0.8d_{50(B)} < d_{50(G)} < 1.2d_{50(B)} \quad (8)$$

where: $d_{50(R)}$ represents an average particle diameter of a red fluorescent substance included in the red fluorescent substance layer; $d_{50(G)}$ represents an average particle diameter of a green fluorescent substance included in the green fluorescent substance layer; and $d_{50(B)}$ represents an average particle diameter of the light-scattering particles.

With the above arrangement, the difference in luminance and color purity between (i) light emitted from the blue pixel and (ii) light emitted from the red fluorescent substance layer and the green fluorescent substance layer is extremely small. The above arrangement can thus reduce variation in luminance and color purity between (i) red light and green light and (ii) blue light which variation occurs in the case where an image is viewed in an oblique direction. Thus, with the above arrangement, the difference in luminance and color purity, which difference occurs in the case where an image is viewed in an oblique direction, between (i) red light and green light and (ii) blue light can be reduced to a level at which the difference is invisible.

The organic EL element of the present invention may preferably be arranged such that the light-scattering particles include an inorganic material.

The above arrangement allows light emitted from the organic EL layer and having a directivity to be diffused or scattered more isotropically and effectively. Further, the use of an inorganic material makes it possible to provide a light-distribution-characteristic adjusting layer that is stable with respect to light and heat.

The organic EL element of the present invention may preferably be arranged such that the light-scattering particles have an average particle diameter of not less than 1 μm and not greater than 50 μm.

If the average particle diameter of the light-scattering particles is 1 μm or less, the light-scattering particles will each have a small particle diameter, which will make it impossible to sufficiently produce the effect of adjusting a light distribution characteristic. The above arrangement can, in contrast, suitably adjust a light distribution characteristic. If the average particle diameter of the light-scattering particles is 50 μm or greater, the light-distribution-characteristic adjusting layer will have a highly uneven surface, which will cause scattering on the surface to be dominant over scattering inside the light-distribution-characteristic adjusting layer. This will in turn make it impossible to produce the effect of adjusting a light distribution characteristic to a desired characteristic. With the above arrangement, in contrast, the light-distribution-characteristic adjusting layer has small unevenness on a surface thereof, which makes it possible to suitably adjust the light distribution characteristic.

The above arrangement thus allows the luminance and color purity of light emitted by the blue pixel to be closer to the luminance and color purity of light emitted by the red fluorescent substance layer and the green fluorescent substance layer. The above arrangement thus makes it possible to achieve an excellent viewing-angle characteristic.

The organic EL element of the present invention may preferably be arranged such that at least one of a red fluorescent substance included in the red fluorescent substance layer and a green fluorescent substance included in the green fluorescent substance layer includes an inorganic material.

With the above arrangement, at least one of the red fluorescent substance layer and the green fluorescent substance layer which at least one includes a red and/or green fluorescent substance including an inorganic material is a layer (film) that is stable with respect to light and heat.

The organic EL element of the present invention may preferably be arranged such that at least one of a red fluorescent substance included in the red fluorescent substance layer and a green fluorescent substance included in the green fluorescent substance layer has an average particle diameter of not less than 0.5 μm and not greater than 50 μm.

With the above arrangement, the average particle diameter of the fluorescent substance is not less than 0.5 μm. This makes it possible to achieve high luminous efficiency. Further, since the average particle diameter is not greater than 50 μm, it is possible to easily form a flat film as a red fluorescent substance layer or green fluorescent substance layer, which can in turn (i) prevent a space from being formed between the red fluorescent substance layer or green fluorescent substance layer and a layer in the vicinity and thus (ii) prevent a decrease in luminous efficiency.

The organic EL element of the present invention may preferably be arranged such that the translucent electrode includes silver. This arrangement allows the reflectance and transmittance of the translucent electrode to be suitable.

The organic EL element of the present invention may preferably be arranged such that the translucent electrode has a film thickness of not less than 10 nm and not greater than 30 nm.

With the above arrangement, the film thickness is not less than 10 nm. This allows the translucent electrode to reflect light sufficiently, and can thus achieve a great interference effect. Further, since the film thickness is not greater than 30 nm, it is possible to efficiently cause light to pass through. This makes it possible to achieve sufficient luminance and luminous efficiency.

The organic EL element of the present invention may preferably be arranged such that the organic EL layer includes a phosphorescent material that emits phosphorescence in a blue range.

The above arrangement allows the luminous efficiency to be high, and can thus reduce power consumption.

The organic EL element of the present invention may preferably further include: a color filter on a surface of each of the red fluorescent substance layer, the green fluorescent substance layer, and the light-distribution-characteristic adjusting layer from which surface light is emitted.

The above arrangement can improve the respective color purities of light emitted from the red fluorescent substance layer, light emitted from the green fluorescent substance layer, and light emitted from the light-distribution-characteristic adjusting layer. Thus, an organic EL display including the above organic EL element can have a widened color reproduction range.

The organic EL element of the present invention may preferably further include: a polarizing plate on a side of the translucent electrode which side is opposite to a side on which the organic EL layer is provided.

The above arrangement can dramatically reduce influence of (i) external light reflected by the translucent electrode and (ii) light emitted from the red fluorescent substance layer and the green fluorescent substance layer as excited by external light. Thus, the above organic EL element can, in the case where it is included in an organic EL display, improve contrast.

The organic EL element of the present invention may preferably further include: a liquid crystal layer for carrying out switching with respect to the red fluorescent substance layer, the green fluorescent substance layer, and the light-distribution-characteristic adjusting layer, the liquid crystal layer being provided between (i) the organic EL layer and (ii) the red fluorescent substance layer, the green fluorescent substance layer, and the light-distribution-characteristic adjusting layer.

The above arrangement allows a liquid crystal layer to function as a so-called switching element. Thus, an organic EL display including the above organic EL element has excellent display quality.

The organic EL display of the present invention may preferably further include: an active element for carrying out active-matrix driving of the organic EL element.

The above arrangement makes it possible to provide an organic EL display that has excellent display quality. Further, such an organic EL display has a light emission period longer than that of an organic EL display of a passive matrix driving type. This makes it possible to (i) reduce a driving voltage for achieving a desired luminance and thus to (ii) reduce power consumption.

The organic EL display of the present invention may preferably be arranged such that the active element is provided on a side of the reflective electrode which side is opposite to a side on which the organic EL layer is provided.

The above arrangement makes it possible to increase the aperture ratio without needing to consider, for example, wiring for the active element. This in turn makes it possible to provide an organic EL display having power consumption reduced to a low level.

The description below deals with Examples to explain an embodiment of the present invention in greater detail. The present invention is naturally not limited by the Examples below; details of the present invention can, needless to say, be varied in different modes.

EXAMPLES

The description below deals in great detail with the present invention on the basis of Examples. The present invention is, however, not at all limited by the Examples below.

Example 1

The present Example prepared an organic EL display apparatus including an organic EL display identical in arrangement to the organic EL display 20 of the first embodiment described above. In the description below, members of the present Example that are identical in function to the respective corresponding constituent members of the organic EL display 20 are each assigned an identical reference numeral.

The present Example first prepared a substrate 1 (organic EL element substrate) provided with the organic EL section 22 formed thereon.

(Organic EL Element Substrate)

The substrate 1 was a glass substrate having a thickness of 0.7 mm. The present Example formed, on the substrate 1, a silver film by sputtering so that the silver film had a thickness of 100 nm. The present Example then formed, on the silver film, a film of indium-tin oxide (ITO) by sputtering so that the ITO film had a thickness of 20 nm. This operation formed a reflective electrode 2 (anode). The present Example next patterned the reflective electrode 2 by publicly known photolithography into 90 stripes each having a width of 2 mm.

The present Example next formed, on the reflective electrode 2, a $SiO_2$ layer with a thickness of 200 nm by sputtering, and patterned the layer by publicly known photolithography so that the layer would cover an edge portion of the reflective electrode 2. This operation formed a partition layer 17. The partition layer 17 was so structured that $SiO_2$ covered a part of the reflective electrode 2 which part extended for 10 µm from the edge of each short side. The present Example washed the product with water, and then carried out, with respect to the product, pure water ultrasonic washing for minutes, acetone ultrasonic washing for 10 minutes, and isopropyl alcohol vapor washing for 5 minutes. The present Example then dried the resulting product at 100° C. for 1 hour.

The present Example next fixed the substrate 1 to a substrate holder in an inline resistance heating vapor deposition device, and reduced the pressure inside the device to a vacuum of $1\times10^{-4}$ Pa or less. The present Example then formed individual organic layers for an organic EL layer 21.

First, the present Example, with use of 1,1-bis-di-4-tolylamino-phenyl-cyclohexane (TAPC) as an electron hole injection material, formed an electron hole injection layer 4 with a film thickness of 120 nm by resistance heating vapor deposition.

The present Example next, with use of N,N'-di-1-naphthyl-N,N'-diphenyl-1,1'-biphenyl-1,1'-biphenyl-4,4'-diamine (NPD) as an electron hole transport material, formed an electron hole transport layer 5 with a film thickness of 40 nm by resistance heating vapor deposition.

The present Example then formed, as a light-emitting layer 6, a blue organic light-emitting layer (thickness: 30 nm) on the electron hole transport layer 5. The present Example prepared this blue organic light-emitting layer by co-depositing 1,4-bis-triphenylsilyl-benzene (UGH-2) (host material) and bis[(4,6-difluorophenyl)-pyridinato-N,C2']picolinate iridium (III) (FIrpic) (blue phosphorescence-emitting dopant) at respective vapor deposition speeds of 1.5 Å/sec and 0.2 Å/sec.

The present Example next formed, with use of 2,9-dimethyl-4,7-diphenyl-1,10-phenanthroline (BCP), an electron hole blocking layer 7 (thickness: 10 nm) on the light-emitting layer 6. The present Example then formed, with use of tris(8-hydroxy quinoline) aluminum ($Alq_3$), an electron transport layer 8 (thickness: 30 nm) on the electron hole blocking layer 7. The present Example next formed, with use of lithium fluoride (LiF), an electron injection layer 9 (thickness: 0.5 nm) on the electron transport layer 8.

The present Example then formed a translucent electrode 10. Specifically, the present Example first fixed the substrate 1 to a metal vapor deposition chamber. The present Example next aligned the substrate 1 with a shadow mask for forming a translucent electrode. This shadow mask was a mask having openings for forming a translucent electrode 10 in the shape of stripes each (i) having a width of 2 mm and (ii) extending in a direction orthogonal to the long-side direction of the reflective electrode 2. The present Example then co-deposited magnesium and silver on a surface of the electron injection layer 9 by vacuum deposition at respective vapor deposition speeds of 0.1 Å/sec and 0.9 Å/sec. This operation formed a desired pattern of magnesium silver with a thickness of 1 nm. The present Example further formed, on the magnesium silver, a desired pattern of silver with a thickness of 19 nm at a vapor deposition speed of 1 Å/sec in order to increase an interference effect and prevent a voltage drop caused in the translucent electrode 10 by wiring resistance. This operation formed a translucent electrode 10.

The reflective electrode 2 and translucent electrode 10 of the organic EL section 22 were separated from each other by an optical distance (total organic film thickness: 230 nm) that was set so that a portion of light emitted from the organic EL layer 21 which portion was emitted from the organic EL section 22 due to a microcavity effect had a peak wavelength of 460 nm and a half width of 50 nm.

The organic EL section 22 prepared as above is capable of (i) achieving a microcavity effect (interference effect) between the reflective electrode 2 and the translucent electrode 10 and thus (ii) emitting light having high frontal luminance. This arrangement allows light emission energy from the organic EL section 22 to be propagated more efficiently to the red fluorescent substance layer 13, the green fluorescent substance layer 14, and the light-distribution-characteristic adjusting layer 15.

The present Example next formed, by plasma CVD, an inorganic sealing film 11 made of $SiO_2$ and having a thickness of 3 μm. The present Example formed the inorganic sealing film 11 with use of a shadow mask so that the inorganic sealing film 11 had a pattern that covered a region of a display section which region (sealing area) extended from the top edge, bottom edge, left edge, and right edge for a width of 2 mm. The display section refers to a portion of the organic EL display at which portion an image is displayed.

The above process prepared an organic EL element substrate.

The present Example next prepared a sealing substrate 16 (fluorescent substance substrate) provided with a red fluorescent substance layer 13, a green fluorescent substance layer 14, and a light-distribution-characteristic adjusting layer 15 all formed thereon.

(Fluorescent Substance Substrate)

The present Example used a glass substrate with a thickness of 0.7 mm as the sealing substrate 16, and formed, on the sealing substrate 16, a red fluorescent substance layer 13, a green fluorescent substance layer 14, and a light-distribution-characteristic adjusting layer 15 each having a width of 3 mm.

The following first describes formation of a red fluorescent substance layer 13. The present Example added 15 g of ethanol and 0.22 g of γ-glycidoxypropyl triethoxysilane to 0.16 g of aerosil having an average particle size of 5 nm, and stirred the mixture in an open system at room temperature for 1 hour. The present Example then placed, in a mortar, this mixture and 20 g of red fluorescent substance $K_5Eu_{2.5}(WO_4)_{6.25}$ having an average particle diameter ($d_{50(R)}$) of 1.0 μm, and crushed and mixed them well. The present Example next heated the resulting mixture in a 70° C. oven for 2 hours, and further heated the resulting mixture in a 120° C. oven for 2 hours. This operation produced $K_5Eu_{2.5}(WO_4)_{6.25}$ having a reformed surface. The present Example then added, to 10 g of the surface-reformed $K_5Eu_{2.5}(WO_4)_{6.25}$, 30 g of polyvinyl alcohol dissolved in a mixed solution (300 g) of water:dimethyl sulfoxide with the ratio of 1:1, and stirred the resulting mixture in a dispersing device. This operation prepared an application liquid (that is, an application liquid for forming a red fluorescent substance). The present Example applied this application liquid to a desired position on the sealing substrate 16 by screen printing so that the resulting layer would have a width of 3 mm. The present Example next heated the substrate in a vacuum oven (conditions: 200° C. and 10 mmHg) for 4 hours to dry it. This operation formed a red fluorescent substance layer 13.

The following now describes formation of a green fluorescent substance layer 14. The present Example added 15 g of ethanol and 0.22 g of γ-glycidoxypropyl triethoxysilane to 0.16 g of aerosil having an average particle size of 5 nm, and stirred the mixture in an open system at room temperature for 1 hour. The present Example then placed, in a mortar, this mixture and 20 g of green fluorescent substance $Ba_2SiO_4$:$Eu^{2+}$ having an average particle diameter ($d_{50(G)}$) of 1.0 μm, and crushed and mixed them well. The present Example next heated the resulting mixture in a 70° C. oven for 2 hours, and further heated the resulting mixture in a 120° C. oven for 2 hours. This operation produced $Ba_2SiO_4$:$Eu^{2+}$ having a reformed surface. The present Example then added, to 10 g of the surface-reformed $Ba_2SiO_4$:$Eu^{2+}$, 30 g of polyvinyl alcohol dissolved in a mixed solution (300 g) of water:dimethyl sulfoxide with the ratio of 1:1, and stirred the resulting mixture in a dispersing device. This operation prepared an application liquid (that is, an application liquid for forming a green fluorescent substance). The present Example applied this application liquid to a desired position on the sealing substrate 16 by screen printing so that the resulting layer would have a width of 3 mm. The present Example next heated the substrate in a vacuum oven (conditions: 200° C. and 10 mmHg) for 4 hours to dry it. This operation formed a green fluorescent substance layer 14.

The following now describes formation of a light-distribution-characteristic adjusting layer 15. The present Example added, to 20 g of silica particles (refractive index: 1.65) having an average particle diameter ($d_{50(B)}$) of 1.5 μm and used as light-scattering particles, 30 g of polyvinyl alcohol dissolved in a mixed solution (300 g) of water:dimethyl sulfoxide with the ratio of 1:1, and stirred the resulting mixture in a dispersing device. This operation prepared an application liquid (that is, an application liquid for forming a light-distribution-characteristic adjusting layer). The present Example applied this application liquid to a desired position on the sealing substrate 16 by screen printing so that the resulting layer would have a width of 3 mm. The present Example next heated the substrate in a vacuum oven (conditions: 200° C. and 10 mmHg) for 4 hours to dry it. This operation formed a light-distribution-characteristic adjusting layer 15.

The process described above prepared a fluorescent substance substrate.

(Combining Process)

The present Example next carried out a combining process for combining the organic EL element substrate and the fluorescent substance substrate both prepared as described above. The present Example, before the combination, applied a thermosetting resin to the fluorescent substance substrate, and closely attached the two substrates with the thermosetting resin therebetween. The present Example carried out alignment with use of an alignment marker formed outside the display section. The present Example then heated the combination at 90° C. for 2 hours to cure the thermosetting resin. The present Example carried out the combining process in a dry-air environment (moisture content: −80° C.) in order to prevent the organic EL section from degrading due to water.

The present Example finally connected, to an outside power supply, terminals formed along the periphery of the organic EL display. This completed preparation of an organic EL display apparatus.

The present Example caused the outside power supply to supply a desired power to the organic EL display apparatus prepared as above, and thus measured (i) respective light distribution characteristics of light from a red pixel, a green pixel, and a blue pixel and (ii) viewing-angle-dependent variations in color purity of such light. The present Example calculated, from values obtained as a result of the above measurement, relative luminances ($L_{60R}/L_{0R}$, $L_{60G}/L_{0G}$, and $L_{60B}/L_{0B}$) achieved by the respective pixels in a direction inclined at an angle of 60 degrees to the frontal direction (where the luminance of light in the frontal direction is represented by 1). The present Example further calculated, as color-purity variation amounts, values (($x_{60R}-x_{0R}$), ($y_{60R}-y_{0R}$), ($x_{60G}-x_{0G}$), ($y_{60G}-y_{0G}$), ($x_{60B}-x_{0B}$), and ($y_{60B}-y_{0B}$)) for the respective pixels each by subtracting (i) a color purity in the frontal direction from (ii) a color purity in the direction inclined at an angle of 60 degrees to the frontal direction.

Figure 5:
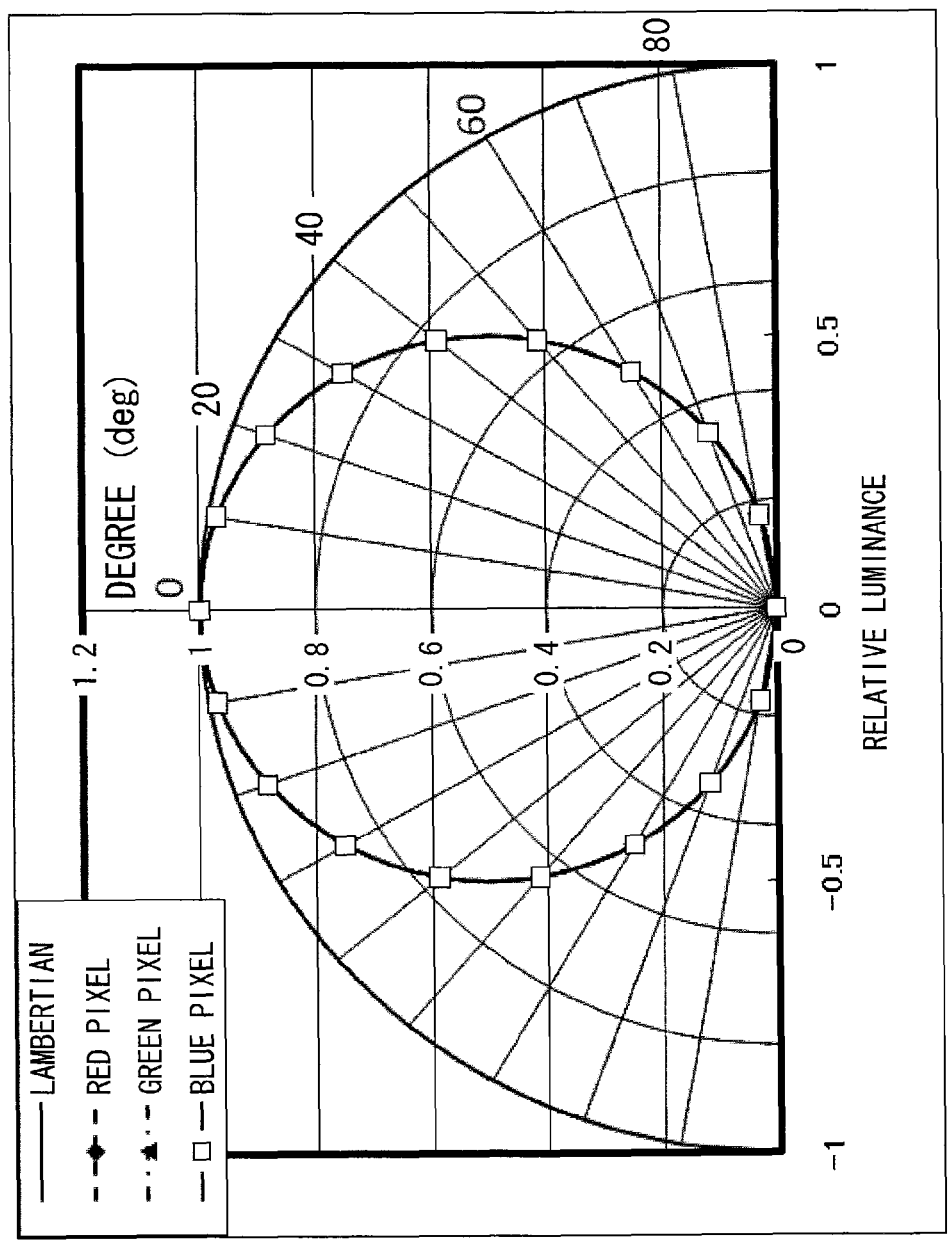
FIG. 5 is a diagram illustrating a light distribution characteristic achieved by an organic EL display apparatus of an Example of the present invention.

The above calculations produced the results shown in FIGS. 5 and 6 and Table 1. FIG. 5 is a diagram illustrating light distribution characteristics achieved by an organic EL display apparatus of an Example of the present invention. FIG. 6 is a graph illustrating viewing-angle-dependent variations in color purity that occur in an organic EL display apparatus of an Example of the present invention.

The above results show that in the present Example, light from the red pixel, light from the green pixel, and light from the blue pixel were all isotropic. The above results also show that (i) there was nearly no difference in relative luminance between the pixels of the respective colors and that (ii) there was nearly no viewing-angle-dependent variation in color purity with respect to the individual pixels. The above results consequently show that the above organic EL display apparatus had (i) a good viewing-angle characteristic and (ii) an extremely small viewing-angle-dependent variation in luminance and color purity between the pixels of the respective colors.

Example 2

The present Example formed (i) a red fluorescent substance layer 13 with use of a red fluorescent substance having an average particle diameter ($d_{50(R)}$) of 20 µm, (ii) a green fluorescent substance layer 14 with use of a green fluorescent substance having an average particle diameter ($d_{50(G)}$) of 25 µm, and (iii) a light-distribution-characteristic adjusting layer 15 with use of silica particles, serving as light-scattering particles, that have an average particle diameter ($d_{50(B)}$) of 20 µm. The present Example prepared an organic EL display apparatus with use of materials and methods identical to those used in Example 1 except for the above arrangement.

The present Example measured, for the above-prepared organic EL display apparatus, (i) respective light distribution characteristics for a red pixel, a green pixel, and a blue pixel and (ii) viewing-angle-dependent variations in color purity. The present Example then, as in Example 1, calculated relative luminances and color-purity variation amounts. Table 1 shows the results of these calculations.

Table 1 shows that (i) there was nearly no difference in relative luminance between the pixels of the respective colors and (ii) there was nearly no viewing-angle-dependent variation in color purity with respect to the individual pixels. Table 1 consequently shows that the above organic EL display apparatus had (i) a good viewing-angle characteristic and (ii) an extremely small viewing-angle-dependent variation in luminance and color purity between the pixels of the respective colors.

Example 3

The present Example formed (i) a red fluorescent substance layer 13 with use of a red fluorescent substance having an average particle diameter ($d_{50(R)}$) of 50 µm, (ii) a green fluorescent substance layer 14 with use of a green fluorescent substance having an average particle diameter ($d_{50(G)}$) of 42 µm, and (iii) a light-distribution-characteristic adjusting layer 15 with use of silica particles, serving as light-scattering particles, that have an average particle diameter ($d_{50(B)}$) of 50 µm. The present Example prepared an organic EL display apparatus with use of materials and methods identical to those used in Example 1 except for the above arrangement.

The present Example measured, for the above-prepared organic EL display apparatus, (i) respective light distribution characteristics for a red pixel, a green pixel, and a blue pixel and (ii) viewing-angle-dependent variations in color purity. The present Example then, as in Example 1, calculated relative luminances and color-purity variation amounts. Table 1 shows the results of these calculations.

Table 1 shows that (i) there was nearly no difference in relative luminance between the pixels of the respective colors and (ii) there was nearly no viewing-angle-dependent variation in color purity with respect to the individual pixels. Table 1 consequently shows that the above organic EL display apparatus had (i) a good viewing-angle characteristic and (ii) an extremely small viewing-angle-dependent variation in luminance and color purity between the pixels of the respective colors.

Example 4

The present Example formed an electron hole injection layer 4 with a film thickness of 140 nm with use of 1,1-bis-di-4-tolylamino-phenyl-cyclohexane (TAPC) as a hole injection material by resistance heating vapor deposition. The present Example was also arranged such that the reflective electrode 2 and translucent electrode 10 of the organic EL section 22 were separated from each other by an optical distance (total organic film thickness: 230 nm) that was set so that a portion of light emitted from the organic EL layer 21 which portion was emitted from the organic EL section 22 due to an microcavity effect had a peak wavelength of 480 nm and a half width of 50 nm. The present Example prepared an organic EL display apparatus with use of materials and methods identical to those used in Example 1 except for the above arrangement.

The present Example measured, for the above-prepared organic EL display apparatus, (i) respective light distribution characteristics for a red pixel, a green pixel, and a blue pixel and (ii) viewing-angle-dependent variations in color purity. The present Example then, as in Example 1, calculated relative luminances and color-purity variation amounts. Table 1 shows the results of these calculations.

Table 1 shows that (i) there was nearly no difference in relative luminance between the pixels of the respective colors and (ii) there was nearly no viewing-angle-dependent variation in color purity with respect to the individual pixels. Table 1 consequently shows that the above organic EL display apparatus had (i) a good viewing-angle characteristic and (ii) an extremely small viewing-angle-dependent variation in luminance and color purity between the pixels of the respective colors.

Example 5

The present Example formed (i) an electron hole injection layer 4 with a film thickness of 100 nm with use of 1,1-bis-di-4-tolylamino-phenyl-cyclohexane (TAPC) as a hole injection material by resistance heating vapor deposition and (ii) a blue organic light-emitting layer (thickness: 30 nm) as a light-emitting layer 6. The present Example prepared this blue organic light-emitting layer by co-depositing (i) 2-(diphenylphosphorin)spirofluorene (SPPO1) (host material) and (ii) [tris(N,N'-diphenylbenzimidazoline-2-ylidene)iridium](Ir(dpbic)$_3$) (blue-phosphorescence-emitting dopant) at respective deposition rates of 1.5 Å/sec and 0.2 Å/sec. The present Example was also arranged such that the reflective electrode 2 and translucent electrode 10 of the organic EL section 22 were separated from each other by an optical distance (total organic film thickness: 200 nm) that was set so that a portion of light emitted from the organic EL layer 21 which portion was emitted from the organic EL section 22 due to an microcavity effect had a peak wavelength of 400 nm and a half width of 50 nm.

The present Example prepared an organic EL display apparatus with use of materials and methods identical to those used in Example 1 except for the above arrangement.

The present Example measured, for the above-prepared organic EL display apparatus, (i) respective light distribution characteristics for a red pixel, a green pixel, and a blue pixel and (ii) viewing-angle-dependent variations in color purity. The present Example then, as in Example 1, calculated relative luminances and color-purity variation amounts. Table 1 shows the results of these calculations.

Table 1 shows that (i) there was nearly no difference in relative luminance between the pixels of the respective colors and (ii) there was nearly no viewing-angle-dependent variation in color purity with respect to the individual pixels. Table 1 consequently shows that the above organic EL display apparatus had (i) a good viewing-angle characteristic and (ii) an extremely small viewing-angle-dependent variation in luminance and color purity between the pixels of the respective colors.

Comparative Example 1

Figure 7:
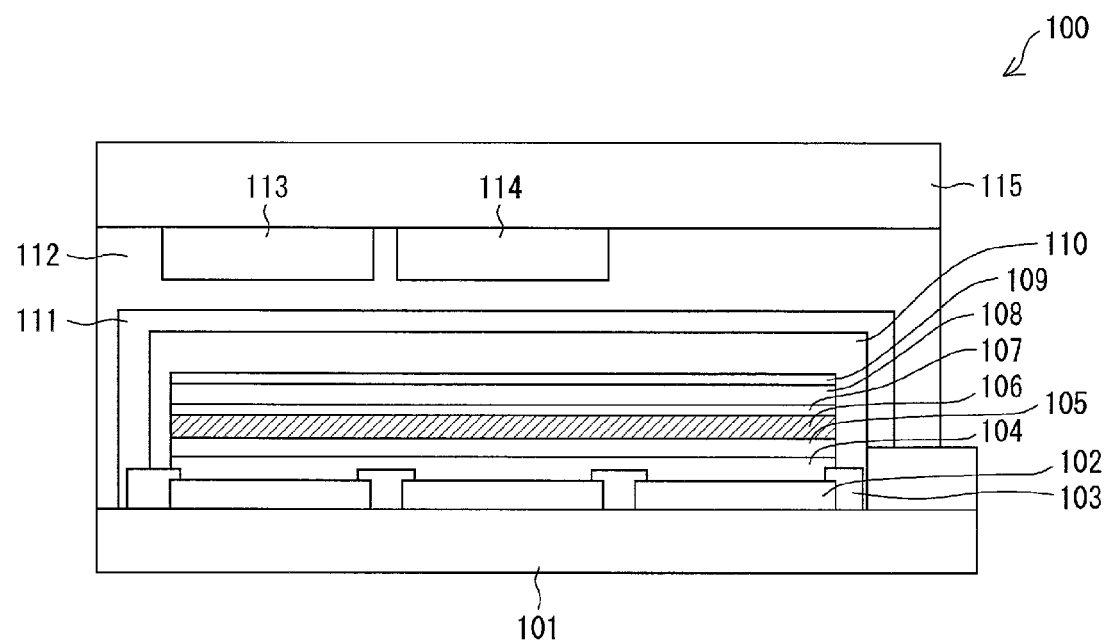
FIG. 7 is a cross-sectional view schematically illustrating a configuration of an organic EL display of a Comparative Example of the present invention.

The present Comparative Example prepared an organic EL display apparatus including an organic EL display 100. The description below deals with an arrangement of the organic EL display 100 with reference to FIG. 7. FIG. 7 is a cross-sectional view schematically illustrating a configuration of an organic EL display of a Comparative Example of the present invention.

The organic EL display 100 included: a substrate 101; a reflective electrode 102; an edge cover 103; an electron hole injection layer 104; an electron hole transport layer 105; a light-emitting layer 106; an electron hole blocking layer 107; an electron transport layer 108; an electron injection layer 109; a translucent electrode 110; an inorganic sealing film 111; a resin sealing film 112; a red fluorescent substance layer 113; a green fluorescent substance layer 114; a sealing substrate 116; and a partition layer 117.

The organic EL display 100 was identical in arrangement to the organic EL display of Example 1 except that it did not include the light-distribution-characteristic adjusting layer 15. More specifically, the substrate 101, the reflective electrode 102, the edge cover 103, the electron hole injection layer 104, the electron hole transport layer 105, the light-emitting layer 106, the electron hole blocking layer 107, the electron transport layer 108, the electron injection layer 109, the translucent electrode 110, the inorganic sealing film 111, the resin sealing film 112, the red fluorescent substance layer 113, the green fluorescent substance layer 114, the sealing substrate 116, and the partition layer 117 were identical in arrangement to the substrate 1, the reflective electrode 2, the edge cover 3, the electron hole injection layer 4, the electron hole transport layer 5, the light-emitting layer 6, the electron hole blocking layer 7, the electron transport layer 8, the electron injection layer 9, the translucent electrode 10, the inorganic sealing film 11, the resin sealing film 12, the red fluorescent substance layer 13, the green fluorescent substance layer 14, the sealing substrate 16, and the partition layer 17, respectively. The organic EL display of the present Comparative Example was prepared by a method that was also identical to that of Example 1.

Figure 8:
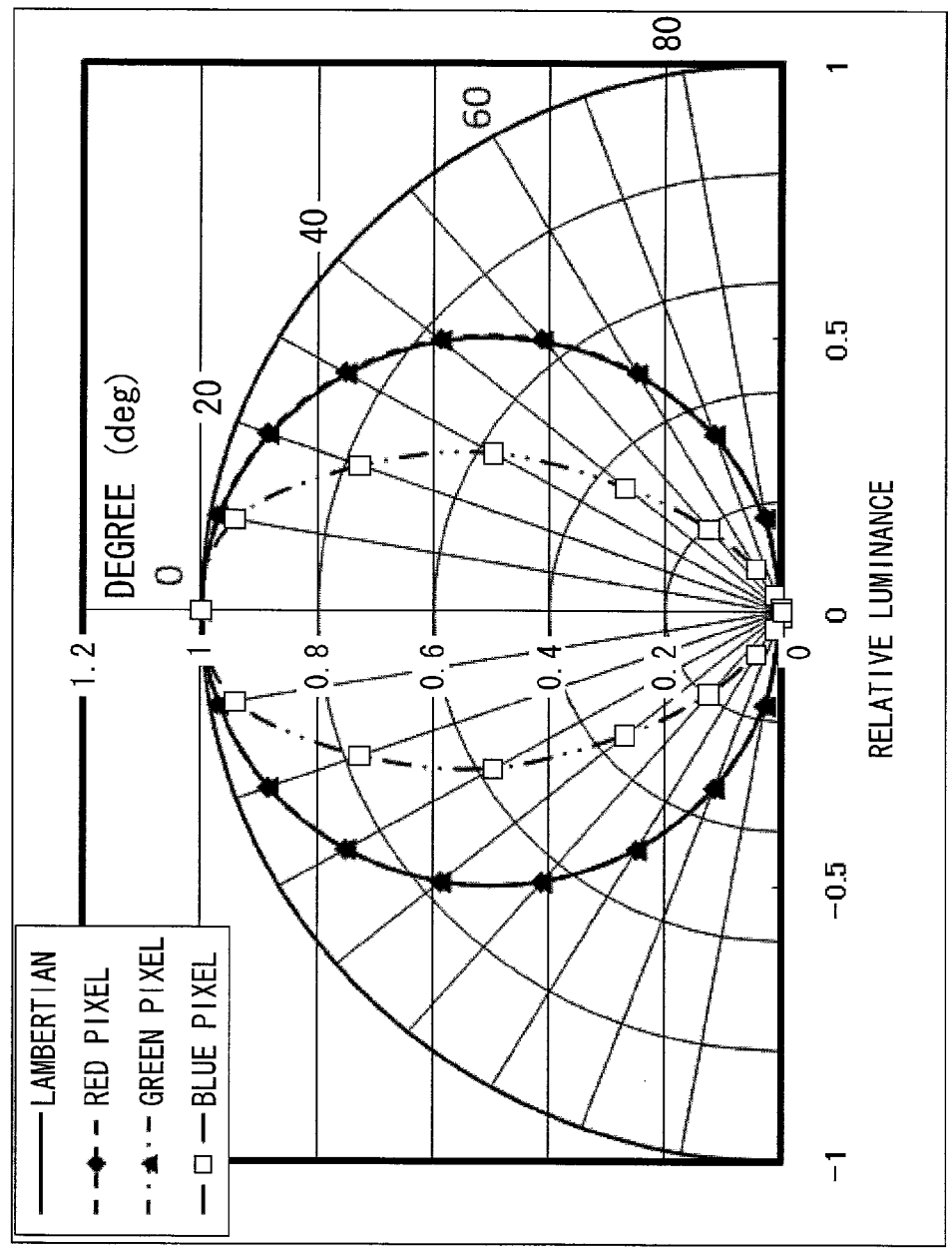
FIG. 8 is a diagram illustrating a light distribution characteristic achieved by an organic EL display apparatus of a Comparative Example of the present invention.
Figure 9:
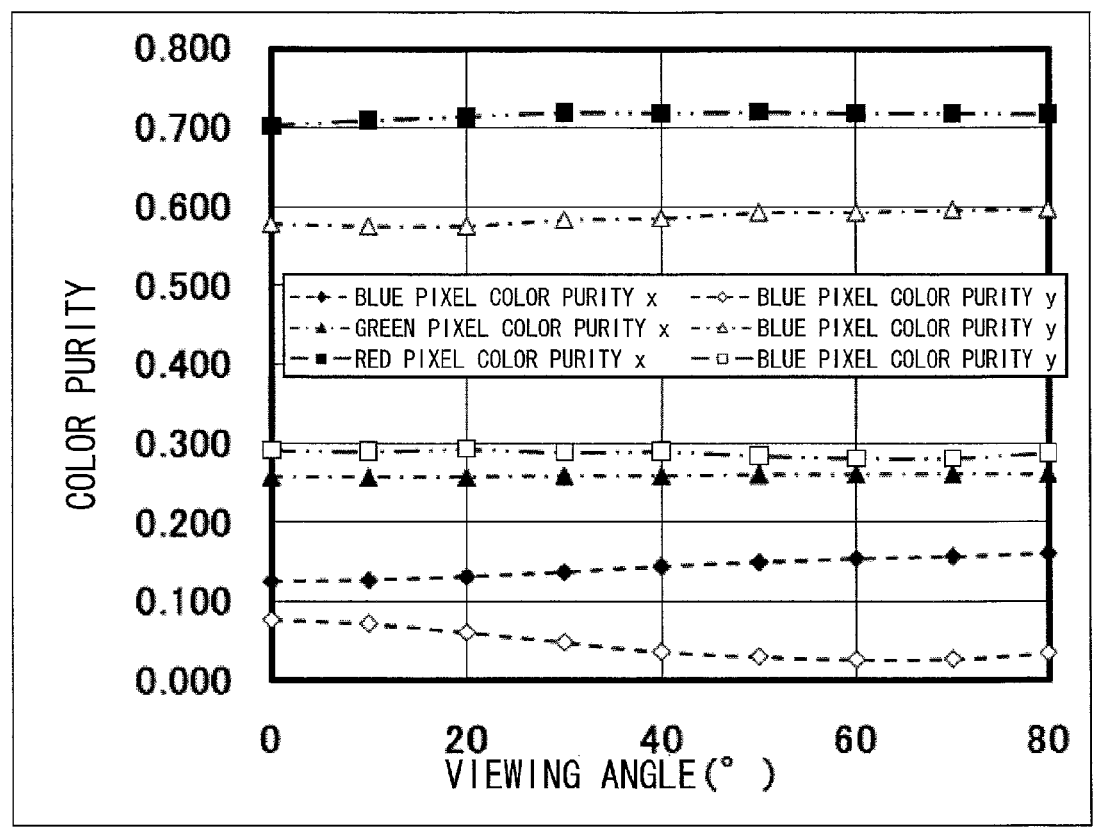
FIG. 9 is a graph illustrating viewing-angle-dependent variations in color purity for an organic EL display apparatus of a Comparative Example of the present invention.

The present Comparative Example measured, for the above-prepared organic EL display apparatus, (i) respective light distribution characteristics for a red pixel, a green pixel, and a blue pixel and (ii) viewing-angle-dependent variations in color purity. The present Comparative Example then, as in Example 1, calculated relative luminances and color-purity variation amounts. These calculations produced the results shown in FIGS. 8 and 9 and Table 1. FIG. 8 is a diagram illustrating light distribution characteristics achieved by an organic EL display apparatus of a Comparative Example of the present invention. FIG. 9 is a graph illustrating viewing-angle-dependent variations in color purity that occur in an organic EL display apparatus of a Comparative Example of the present invention.

The above results show that in the present Comparative Example, light from the red pixel and light from the green pixel were isotropic, but light from the blue pixel was light having a directivity. The above results thus suggest that a color as viewed in an oblique direction would be shifted to be closer to yellow as compared to a color as viewed in the frontal direction. Further, light from the blue pixel was smaller in relative luminance and larger in color-purity variation amount than light from the other pixels.

Comparative Example 2

The present Comparative Example formed (i) a red fluorescent substance layer 13 with use of a red fluorescent substance having an average particle diameter ($d_{50(R)}$) of 1.0 μm, (ii) a green fluorescent substance layer 14 with use of a green fluorescent substance having an average particle diameter ($d_{50(G)}$) of 1.0 μm, and (iii) a light-distribution-characteristic adjusting layer 15 with use of silica particles, serving as light-scattering particles, that have an average particle diameter ($d_{50(B)}$) of 0.5 μm. The present Comparative Example prepared an organic EL display apparatus with use of materials and methods identical to those used in Example 1 except for the above arrangement.

The present Comparative Example measured, for the above-prepared organic EL display apparatus, (i) respective light distribution characteristics for a red pixel, a green pixel, and a blue pixel and (ii) viewing-angle-dependent variations in color purity. The present Comparative Example then, as in Example 1, calculated relative luminances and color-purity variation amounts. Table 1 shows the results of these calculations. As shown in Table 1, light from the blue pixel was smaller in relative luminance and larger in color-purity variation amount than light from the other pixels.

Comparative Example 3

The present Comparative Example formed (i) a red fluorescent substance layer 13 with use of a red fluorescent substance having an average particle diameter ($d_{50(R)}$) of 1.0 μm, (ii) a green fluorescent substance layer 14 with use of a green fluorescent substance having an average particle diameter ($d_{50(G)}$) of 1.0 μm, and (iii) a light-distribution-characteristic adjusting layer 15 with use of silica particles having an average particle diameter ($d_{50(B)}$) of 100 μm. The present Comparative Example prepared an organic EL display apparatus with use of materials and methods identical to those used in Example 1 except for the above arrangement.

The present Comparative Example measured, for the above-prepared organic EL display apparatus, (i) respective light distribution characteristics for a red pixel, a green pixel, and a blue pixel and (ii) viewing-angle-dependent variations in color purity. The present Comparative Example, as in Example 1, calculated relative luminances and color-purity variation amounts. Table 1 shows the results of these calculations. As shown in Table 1, light from the blue pixel was smaller in relative luminance and larger in color-purity variation amount than light from the other pixels.

then formed an acrylic resin layer for functioning as a planarizing film 47, and formed, at a position in the acrylic resin

TABLE 1

| | | | Light | Red pixel | | Green pixel | | Blue pixel | |
|---|---|---|---|---|---|---|---|---|---|
| | Red fluorescent substance $d_{50(R)}$ (μm) | Green fluorescent substance $d_{50(G)}$ (μm) | distribution characteristic adjusting layer $d_{50(B)}$ (μm) | Relative luminance[1] | Color purity variation amount[2] (x, y) | Relative luminance[1] | Color purity variation amount[2] (x, y) | Relative luminance[1] | Color purity variation amount[2] (x, y) |
| Example 1 | 1.0 | 1.0 | 1.5 | 1.03 | 0.016, −0.010 | 0.98 | 0.003, 0.015 | 1.00 | 0.000, −0.002 |
| Example 2 | 20 | 25 | 20 | 0.90 | 0.014, 0.08 | 0.85 | 0.008, 0.012 | 1.02 | 0.002, −0.005 |
| Example 3 | 50 | 42 | 50 | 0.76 | 0.014, 0.08 | 0.80 | 0.008, 0.012 | 0.64 | 0.002, −0.005 |
| Example 4 | 1.0 | 1.0 | 1.5 | 1.01 | 0.012, −0.08 | 0.97 | 0.008, 0.010 | 1.00 | 0.001, −0.004 |
| Example 5 | 1.0 | 1.0 | 1.5 | 0.95 | 0.012, 0.04 | 0.90 | 0.005, 0.011 | 1.05 | 0.002, −0.003 |
| Comparative Example 1 | 1.0 | 1.0 | — | 1.01 | 0.016, −0.010 | 1.00 | 0.003, 0.015 | 0.18 | 0.029, −0.050 |
| Comparative Example 2 | 1.0 | 1.0 | 0.5 | 1.02 | 0.014, 0.08 | 1.01 | 0.005, 0.013 | 0.51 | 0.012, −0.025 |
| Comparative Example 3 | 1.0 | 1.0 | 100 | 0.95 | 0.015, 0.09 | 0.96 | 0.006, 0.014 | 0.22 | 0.017, −0.030 |

[1] Value of the luminance of light in a direction inclined at an angle of 60 degrees to the frontal direction which value is relative to the value of the luminance of the light in the frontal direction
[2] Color purity variation amount = (Color purity in a direction inclined at an angle of 60 degrees) − (Color purity in the frontal direction)

Example 6

The present Example prepared an organic EL display apparatus including an organic EL display identical in arrangement to the organic EL display 40 of the second embodiment described above. In the description below, members of the present Example that are identical in function to the respective corresponding constituent members of the organic EL display 40 are each assigned an identical reference numeral.

The present Example first prepared a substrate 1 (active element substrate) provided with active elements formed thereon.

(Active Element Substrate)

The present Example used, as the substrate 1, a glass substrate having a size of 100×100 mm, and formed, on the substrate 1, an amorphous silicon semiconductor film by PECVD. The present Example then carried out a crystallizing process with respect to the amorphous silicon semiconductor film to form a polycrystalline silicon semiconductor film. The present Example next carried out photolithography to pattern the polycrystalline silicon semiconductor film into the shape of a plurality of islands. The present Example then formed, on the patterned polycrystalline silicon semiconductor layer, a gate insulating film 44 and a gate electrode 41 in that order, and carried out photolithography to pattern the gate insulating film 44 and the gate electrode 41. The present Example next doped the patterned polycrystalline silicon semiconductor film with an impurity element such as phosphorus to form a source electrode 43 and a drain electrode 42. This prepared TFT elements.

The present Example next formed a planarizing film 47. The present Example formed this planarizing film 47 by laminating (i) a silicon nitride film formed by PECVD with (ii) an acrylic resin layer with use of a spin coater. The present Example first formed a silicon nitride film, and then carried out etching with respect to the silicon nitride film and the gate insulating film 44 together to form a contact hole leading to the source electrode 43 and/or the drain electrode 42. The present Example next formed a wire 45. The present Example layer which position coincided with the position of the contact hole that was formed in the gate insulating film 44 and the silicon nitride film and that led to the drain electrode 42, a contact hole leading to the drain electrode 42. This completed preparation of an active matrix substrate.

The present Example formed, by providing an insulating film such as an interlayer insulating film between (i) the drain electrode 42 of a switching TFT and (ii) the source electrode 43 of a driving TFT, a capacitor for causing a gate potential of each TFT to be a constant potential.

The active matrix substrate included on a surface thereof a contact hole penetrating through the planarizing film 47 so that the driving TFT was electrically connected to the reflective electrode 2 corresponding to each pixel of the organic EL section 22.

The present Example next formed, by sputtering, a reflective electrode 2 (anode) that would be electrically connected, via contact holes so formed as to penetrate through the planarizing film 47, to TFTs for driving the individual pixels. The present Example formed the reflective electrode 2 by laminating (i) an Al (aluminum) film with a thickness of 150 nm and (ii) an IZO (indium oxide-zinc oxide) film with a thickness of 20 nm. The present Example then patterned, by publicly known photolithography, the reflective electrode 2 into a shape corresponding to the individual pixels. The reflective electrode 2 of the present Example had an area of 300 μm×100 μm.

The present Example (i) formed, on the substrate 1 having a size of 100×100 mm, a display section having a size of 80×80 mm, and (ii) provided a sealing area with a width of 2 mm along a top edge, bottom edge, left edge, and right edge of the display section. The present Example further provided, (i) along each short side, a terminal takeout section with a width of 2 mm outside the sealing area and (ii) along each long side, a terminal takeout section with a width of 2 mm on the side to which the substrate 1 was to be bent.

The present Example then laminated (i) the reflective electrode 2 with (ii) a SiO$_2$ layer by sputtering so that the layer would have a thickness of 200 nm, and (ii) carried out publicly known photolithography to pattern the layer so that the layer would cover an edge portion of the reflective electrode 2. The present Example (i) covered, with $SiO_2$, an area along each of the four sides of the reflective electrode 2 which area extended for 10 μm, and (ii) used this layer as the edge cover 3.

The process described above prepared an active element substrate. The present Example washed this active element substrate before the next process. Specifically, the present Example washed the active element substrate by ultrasonic washing involving acetone and IPA for 10 minutes and then by UV-ozone washing for 30 minutes.

The present Example next prepared an organic EL element substrate with use of the above active element substrate.

(Organic EL Element Substrate)

The present Example, with use of the above active element substrate, formed an organic EL layer 21, a translucent electrode 10, and an inorganic sealing film 11 with use of the materials and methods used in Example 1. This prepared an organic EL element substrate.

The present Example then prepared a sealing substrate 16 (fluorescent substance substrate) provided with a red fluorescent substance layer 13, a green fluorescent substance layer 14, and a light-distribution-characteristic adjusting layer 15 formed thereon.

(Fluorescent Substance Substrate)

The present Example prepared a fluorescent substance substrate with use of materials and methods that are similar to those used in Example 1.

The present Example formed a red fluorescent substance layer 13 by (i) using, as a red fluorescent substance, red fluorescent substance $K_5Eu_{2.5}(WO_4)_{6.25}$ having an average particle diameter ($d_{50(R)}$) of 1.0 μm and (ii) applying an application liquid for forming a red fluorescent substance so that the applied liquid would have a width of 110 μm.

The present Example formed a green fluorescent substance layer 14 by (i) using, as a green fluorescent substance, green fluorescent substance $Ba_2SiO_4:Eu^{2+}$ having an average particle diameter ($d_{50(R)}$) of 1.0 μm and (ii) applying an application liquid for forming a green fluorescent substance so that the applied liquid would have a width of 110 μm.

The present Example formed a light-distribution-characteristic adjusting layer 15 by applying the application liquid for forming a light-distribution-characteristic adjusting layer, the application liquid being used in Example 1, so that the applied liquid would have a width of 110 μm.

The process described above prepared a fluorescent substance substrate.

(Combining Process)

The present Example next combined the organic EL element substrate with the fluorescent substance substrate through a process similar to the combining process of Example 1.

The present Example finally connected, (i) to a power supply circuit via a source driver, terminals formed along each short side of the substrate and, (ii) to an outside power supply via a gate driver, terminals formed along each long side. This completed production of an active driving type organic EL display apparatus having a display section with a size of 80×80 mm.

The present Example caused the outside power supply to supply a desired power to the organic EL display apparatus prepared as above. This organic EL display apparatus, in response, produced an image having a good viewing-angle characteristic.

Example 7

The present Example prepared an organic EL display apparatus including an organic EL display identical in arrangement to the organic EL display 60 of the third embodiment described above. In the description below, members of the present Example that are identical in function to the respective corresponding constituent members of the organic EL display 60 are each assigned an identical reference numeral.

The present Example (i) prepared an organic EL element substrate with use of materials and methods similar to those used in Example 1, and (ii) carried out the processes below to prepare a liquid crystal substrate and a fluorescent substance substrate.

(Liquid Crystal Substrate)

The present Example (i) used a glass substrate as a substrate 62, and (ii) formed, on that glass substrate by a publicly known method, switching elements formed by TFTs. The present Example then formed an ITO transparent electrode with a film thickness of 100 nm which ITO transparent electrode was electrically connected to the TFTs via respective contact holes. The present Example next carried out publicly known photolithography to pattern the ITO transparent electrode into a transparent electrode 63 having a pitch equal to that of pixels in an organic EL section 22 of the organic EL element substrate. The present Example then formed an alignment film 64 by a printing method.

(Fluorescent Substance Substrate)

The present Example formed, on a sealing substrate 16, a red fluorescent substance layer 13, a green fluorescent substance layer 14, and a light-distribution-characteristic adjusting layer 15 by a method similar to that used in Example 1. The present Example then formed, on the red fluorescent substance layer 13, the green fluorescent substance layer 14, and the light-distribution-characteristic adjusting layer 15, a planarizing film 66 with use of an acrylic resin by spin coating.

The present Example next formed, on the planarizing film 66, a polarizing film 61, a transparent electrode 63, and an alignment film 64 by a publicly known method.

The present Example then prepared a liquid crystal/fluorescent substance substrate with use of the liquid crystal substrate and the fluorescent substance substrate.

(Liquid Crystal/Fluorescent Substance Substrate)

The present Example (i) adhered the liquid crystal substrate to the fluorescent substance substrate with 10-μm spacers therebetween, and (ii) injected a TN-mode liquid crystal material therebetween to form a liquid crystal layer 65. The present Example then formed, by a publicly known method, a polarizing film 61 on a surface of the substrate 62 which surface was opposite to the surface on which the transparent electrode 63 had been formed. This process completed preparation of a liquid crystal/fluorescent substance substrate.

(Combining Process)

The present Example next carried out a combining process for combining the organic EL element substrate and the liquid crystal/fluorescent substance substrate. The present Example, before the combination, applied a thermosetting resin to the liquid crystal/fluorescent substance substrate, and closely attached the two substrates with the thermosetting resin therebetween. The present Example carried out alignment and curing as in Example 1.

The present Example finally connected, to an outside power supply, terminals formed along the periphery of the organic EL display. This completed preparation of an organic EL display apparatus.

The present Example, for the above-prepared organic EL display apparatus, caused the outside power supply to (i) supply a desired power to the organic EL section 22 and (ii) apply, to the transparent electrode 63 in a liquid crystal section, a desired voltage for driving liquid crystal. The organic EL display apparatus, in response, produced an image having a good viewing-angle characteristic.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

INDUSTRIAL APPLICABILITY

The present invention can inexpensively provide an organic EL element having (i) a good viewing-angle characteristic and (ii) only a small viewing-angle-dependent variation in luminance and color purity between pixels of the individual colors. The present invention is thus suitably applicable to, for example, an organic EL display and an organic EL display apparatus.

REFERENCE SIGNS LIST 2 reflective electrode
10 translucent electrode
13 red fluorescent substance layer
14 green fluorescent substance layer
15 light-distribution-characteristic adjusting layer
20 organic EL display
21 organic EL layer
35 driving TFT (active element)
40 organic EL display
60 organic EL display
61 polarizing film (polarizing plate)
65 liquid crystal layer

The invention claimed is:

1. An organic EL element comprising:
a reflective electrode and a translucent electrode having a structure producing a microcavity effect;
an organic EL layer for emitting blue light, the organic EL layer being sandwiched between the reflective electrode and the translucent electrode;
a red fluorescent substance layer for converting the light from the organic EL layer into light in a red range;
a green fluorescent substance layer for converting the light from the organic EL layer into light in a green range; and
a blue pixel allowing the light from the organic EL layer to transmit therethrough,
the red fluorescent substance layer and the green fluorescent substance layer including microparticles on a sub-micron order, and
the blue pixel being constituted by a light-distribution-characteristic adjusting layer for adjusting a light distribution characteristic of light from the organic EL layer.

2. The organic EL element according to claim 1, wherein:
the light-distribution-characteristic adjusting layer adjusts (i) luminance of the light from the organic EL layer so as to cause the luminance of the light from the organic EL layer to be close to luminance of light emitted from the red fluorescent substance layer and to luminance of light emitted from the green fluorescent substance layer and (ii) color purity of the light from the organic EL layer so as to cause the color purity of the light from the organic EL layer to be close to color purity of the light emitted from the red fluorescent substance layer and to color purity of the light emitted from the green fluorescent substance layer.

3. The organic EL element according to claim 1, wherein:
the light-distribution-characteristic adjusting layer adjusts the light distribution characteristic of the light from the organic EL layer so as to satisfy Formulae (1) and (2) below:

$$0.8 L_{60R}/L_{0R} < L_{60B}/L_{0B} < 1.2 L_{60R}/L_{0R} \quad (1)$$

$$0.8 L_{60G}/L_{0G} < L_{60B}/L_{0B} < 1.2 L_{60G}/L_{0G} \quad (2)$$

where:
$L_{0R}$ represents a luminance, in a frontal direction, of light emitted from the red fluorescent substance layer;
$L_{60R}$ represents a luminance, in a direction inclined at 60 degrees to the frontal direction, of the light emitted from the red fluorescent substance layer;
$L_{0G}$ represents a luminance, in a frontal direction, of light emitted from the green fluorescent substance layer;
$L_{60G}$ represents a luminance, in a direction inclined at 60 degrees to the frontal direction, of the light emitted from the green fluorescent substance layer;
$L_{0B}$ represents a luminance, in a frontal direction, of light emitted from the light-distribution-characteristic adjusting layer; and
$L_{60B}$ represents a luminance, in a direction inclined at 60 degrees to the frontal direction, of the light emitted from the light-distribution-characteristic adjusting layer.

4. The organic EL element according to claim 1, wherein:
the light-distribution-characteristic adjusting layer adjusts the light distribution characteristic of the light from the organic EL layer so as to satisfy Formulae (3) through (6) below:

$$|x_{60R} - x_{0R}| \geq |x_{60B} - x_{0B}| \quad (3)$$

$$|y_{60R} - y_{0R}| \geq |y_{60B} - y_{0B}| \quad (4)$$

$$|x_{60G} - x_{0g}| \geq |x_{60B} - x_{0B}| \quad (5)$$

$$|y_{60G} - y_{0G}| \geq |y_{60B} - y_{0B}| \quad (6)$$

where:
$(x_{0R}, y_{0R})$ represents a color purity, in a frontal direction, of light emitted from the red fluorescent substance layer;
$(x_{60R}, y_{60R})$ represents a color purity, in a direction inclined at 60 degrees to the frontal direction, of the light emitted from the red fluorescent substance layer;
$(x_{0G}, y_{0G})$ represents a color purity, in a frontal direction, of light emitted from the green fluorescent substance layer;
$(x_{60G}, y_{60G})$ represents a color purity, in a direction inclined at 60 degrees to the frontal direction, of the light emitted from the green fluorescent substance layer;
$(x_{0B}, y_{0B})$ represents a color purity, in a frontal direction, of light emitted from the light-distribution-characteristic adjusting layer; and
$(x_{60B}, y_{60B})$ represents a color purity, in a direction inclined at 60 degrees to the frontal direction, of the light emitted from the light-distribution-characteristic adjusting layer.

5. The organic EL element according to claim 1, wherein:
the light emitted by the organic EL layer has an emission intensity having a maximum value corresponding to a wavelength of not less than 400 nm and not greater than 480 nm.

6. The organic EL element according to claim 1, wherein:
the light-distribution-characteristic adjusting layer includes light-scattering particles for scattering light; and
the organic EL element satisfies Formulae (7) and (8) below:

$$0.8 d_{50(B)} < d_{50(R)} < 1.2 d_{50(B)} \quad (7)$$

$$0.8 d_{50(B)} < d_{50(G)} < 1.2 d_{50(B)} \quad (8)$$

where:
$d_{50(R)}$ represents an average particle diameter of a red fluorescent substance included in the red fluorescent substance layer;
$d_{50(G)}$ represents an average particle diameter of a green fluorescent substance included in the green fluorescent substance layer; and
$d_{50(B)}$ represents an average particle diameter of the light-scattering particles.

7. The organic EL element according to claim 6, wherein:
the light-scattering particles include an inorganic material.

8. The organic EL element according to claim 6, wherein:
the light-scattering particles have an average particle diameter of not less than 1 μm and not greater than 50 μm.

9. The organic EL element according to claim 1, wherein:
at least one of a red fluorescent substance included in the red fluorescent substance layer and a green fluorescent substance included in the green fluorescent substance layer includes an inorganic material.

10. The organic EL element according to claim 1, wherein:
at least one of a red fluorescent substance included in the red fluorescent substance layer and a green fluorescent substance included in the green fluorescent substance layer has an average particle diameter of not less than 0.5 μm and not greater than 50 μm.

11. The organic EL element according to claim 1, wherein:
the translucent electrode includes silver.

12. The organic EL element according to claim 1, wherein:
the translucent electrode has a film thickness of not less than 10 nm and not greater than 30 nm.

13. The organic EL element according to claim 1, wherein:
the organic EL layer includes a phosphorescent material that emits phosphorescence in a blue range.

14. The organic EL element according to claim 1, further comprising:
a color filter on a surface of each of the red fluorescent substance layer, the green fluorescent substance layer, and the light-distribution-characteristic adjusting layer from which surface light is emitted.

15. The organic EL element according to claim 1, further comprising:
a polarizing plate on a side of the translucent electrode which side is opposite to a side on which the organic EL layer is provided.

16. The organic EL element according to claim 1, further comprising:
a liquid crystal layer for carrying out switching with respect to the red fluorescent substance layer, the green fluorescent substance layer, and the light-distribution-characteristic adjusting layer, the liquid crystal layer being provided between (i) the organic EL layer and (ii) the red fluorescent substance layer, the green fluorescent substance layer, and the light-distribution-characteristic adjusting layer.

17. An organic EL display comprising:
the organic EL element according to claim 1.

18. The organic EL display according to claim 17, further comprising:
an active element for carrying out active-matrix driving of the organic EL element.

19. The organic EL display according to claim 18, wherein:
the active element is provided on a side of the reflective electrode which side is opposite to a side on which the organic EL layer is provided.

20. An organic EL display apparatus comprising:
the organic EL display according to claim 17.

\* \* \* \* \*